(12) United States Patent
Park et al.

(10) Patent No.: US 11,886,069 B1
(45) Date of Patent: Jan. 30, 2024

(54) DISPLAY DEVICE AND POSITION INPUT SYSTEM INCLUDING THE SAME

(71) Applicant: Samsung Display Co., LTD., Yongin-si (KR)

(72) Inventors: Gil Yeong Park, Yongin-si (KR); Da Som Gu, Yongin-si (KR); Ki Jun Roh, Yongin-si (KR); Sung Guk An, Yongin-si (KR); Hee Young Lee, Yongin-si (KR); So Yeon Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/176,287

(22) Filed: Feb. 28, 2023

(30) Foreign Application Priority Data

Jul. 22, 2022 (KR) .......................... 10-2022-0090891

(51) Int. Cl.
*G02F 1/1335* (2006.01)
*G02F 1/1333* (2006.01)
*G06F 3/041* (2006.01)
*G06F 3/0354* (2013.01)

(52) U.S. Cl.
CPC .... *G02F 1/133512* (2013.01); *G02F 1/13338* (2013.01); *G02F 1/133331* (2021.01); *G02F 1/133553* (2013.01); *G06F 3/03545* (2013.01); *G06F 3/04162* (2019.05); *G02F 1/133504* (2013.01); *G02F 2201/086* (2013.01); *G02F 2203/11* (2013.01)

(58) Field of Classification Search
CPC ............. G06F 3/04162; G06F 3/03545; G06F 3/03542; G06F 3/0386; G02F 1/133512; G02F 1/133331; G02F 1/13338; G02F 1/133553; G02F 1/133504; G02F 2201/086; G02F 2203/11
See application file for complete search history.

(56) References Cited

U.S. PATENT DOCUMENTS

| | | | |
|---|---|---|---|
| 11,693,493 B2 * | 7/2023 | Choi | G06F 3/041 345/179 |
| 2018/0046326 A1 * | 2/2018 | Yao | G06F 3/03545 |
| 2022/0011886 A1 * | 1/2022 | Choi | G06F 3/041 |

FOREIGN PATENT DOCUMENTS

| | | |
|---|---|---|
| KR | 10-1243717 B1 | 3/2013 |
| KR | 10-2014-0011046 A | 1/2014 |
| KR | 10-2212049 B1 | 2/2021 |
| KR | 10-2346300 B1 | 1/2022 |
| KR | 102346300 B1 * | 1/2022 |
| KR | 10-2380155 B1 | 3/2022 |

* cited by examiner

*Primary Examiner* — Michael Pervan
(74) *Attorney, Agent, or Firm* — Lewis Roca Rothgerber Christie LLP

(57) ABSTRACT

A display device includes: a display panel; and a stacked structure on the display panel, wherein the stacked structure includes: a first coupling member on the display panel; a reflective layer on the first coupling member; a second coupling member on the reflective layer; a code pattern part on the second coupling member; and a light blocking layer on the code pattern part and including an ultraviolet absorber, and a thickness between a lower surface of the reflective layer and an upper surface of the light blocking layer is 100 μm or less.

20 Claims, 16 Drawing Sheets

DISPLAY DEVICE AND POSITION INPUT SYSTEM INCLUDING THE SAME

CROSS-REFERENCE TO RELATED APPLICATION

The present application claims priority to and the benefit of Korean Patent Application No. 10-2022-0090891 filed on Jul. 22, 2022 in the Korean Intellectual Property Office, the entire content of which is incorporated herein by reference.

BACKGROUND

1. Field

Aspects of some embodiments of the present disclosure relate to a display device and a position input system including the same.

2. Description of the Related Art

As the information society develops, the demand for display devices for displaying images has increased and various potential uses have become more diversified. For example, display devices have been applied to various electronic devices such as smartphones, digital cameras, laptop computers, navigation devices, and smart televisions. Display devices may include, for example, flat panel display devices such as liquid crystal display devices, field emission display devices, or organic light emitting display devices. Among such flat panel display devices, a light emitting display device may display images without a backlight unit providing light to a display panel because each of pixels of the display panel includes light emitting elements that may emit light by themselves.

Recent display devices have supported a touch input using a portion (e.g., a finger) of a user's body and a touch input using an electronic pen. For example, the display device may sense the touch input using the electronic pen more precisely than when only the touch input using a portion of the user's body is used, by sensing a pointer such as the electronic pen or a use position of the pointer.

The above information disclosed in this Background section is only for enhancement of understanding of the background and therefore the information discussed in this Background section does not necessarily constitute prior art.

SUMMARY

Aspects of some embodiments of the present disclosure include a display device capable of preventing or reducing deterioration of light emitting layers and code patterns, and a position input system including the same.

However, aspects of some embodiments of the present disclosure are not restricted to those set forth herein. The above and other characteristics of embodiments of the present disclosure will become more apparent to one of ordinary skill in the art to which the disclosure pertains by referencing the detailed description of the disclosure given below.

According to some embodiments of the present disclosure, a display device comprises a display panel, and a stacked structure on the display panel, wherein the stacked structure includes a first coupling member on the display panel, a reflective layer on the first coupling member, a second coupling member on the reflective layer, a code pattern part on the second coupling member, and a light blocking layer on the code pattern part and including an ultraviolet absorber, and a thickness between a lower surface of the reflective layer and an upper surface of the light blocking layer is 100 μm or less.

According to some embodiments, the light blocking layer has a light transmittivity of 20% or less at a wavelength of 380 nm.

According to some embodiments, the light blocking layer has a light transmittivity of 20% or less at a wavelength of 405 nm.

According to some embodiments, the code pattern part includes a base and code patterns on the base, and the light blocking layer is in contact with the base and the code patterns.

According to some embodiments, the display device further comprises a third coupling member on the light blocking layer, and a cover window on the third coupling member.

According to some embodiments, the display device further comprises a third coupling member between the code pattern part and the light blocking layer, wherein the third coupling member includes diffusion particles.

According to some embodiments, the display device further comprises a cover window and a fourth coupling member between the third coupling member and the light blocking layer, wherein the cover window is on the third coupling member, and the fourth coupling member is between the cover window and the light blocking layer.

According to some embodiments, the light blocking layer is manufactured in the form of a film or a plate.

According to some embodiments of the present disclosure, a display device comprises a display panel, and a stacked structure on the display panel, wherein the stacked structure includes a first coupling member on the display panel, a reflective layer on the first coupling member, a second coupling member on the reflective layer, a code pattern part on the second coupling member, a third coupling member on the code pattern part and including an ultraviolet absorber, and a cover window on the third coupling member, and a thickness between a lower surface of the reflective layer and an upper surface of the code pattern part is 100 μm or less.

According to some embodiments, a thickness of the third coupling member is 100 μm or less.

According to some embodiments, the third coupling member includes diffusion particles.

According to some embodiments, the third coupling member has a light transmittivity of 20% or less at a wavelength of 380 nm.

According to some embodiments, the display device further comprises a fourth coupling member on the cover window, and a light blocking layer on the fourth coupling member, wherein the light blocking layer includes an ultraviolet absorber.

According to some embodiments of the present disclosure, a display device comprises a display panel, and a stacked structure on the display panel, wherein the stacked structure includes a first coupling member on the display panel, a reflective layer on the first coupling member, a second coupling member on the reflective layer, and a code pattern part on the second coupling member and including a base and code patterns on one surface of the base, the base includes an ultraviolet absorber, and a thickness between a lower surface of the reflective layer and an upper surface of the code pattern part is 100 μm or less.

According to some embodiments, the substrate has a light transmittivity of 20% or less at a wavelength of 380 nm.

According to some embodiments of the present disclosure, a position input system comprises a display device displaying an image, and a position input device inputting position coordinate data to the display device, wherein the display device includes a display panel, and a stacked structure on the display panel, the stacked structure includes a first coupling member on the display panel, a reflective layer on the first coupling member, a second coupling member on the reflective layer, a code pattern part on the second coupling member and including code patterns, and a light blocking layer on the code pattern part and including an ultraviolet absorber, and a thickness between a lower surface of the reflective layer and an upper surface of the light blocking layer is 100 μm or less.

According to some embodiments, the position input device includes a code detection unit detecting the code patterns, a code processor receiving shape data for the code patterns, extracting data codes corresponding to shapes of the code patterns, and generating the position coordinate data corresponding to the data codes, and a communication module transmitting the position coordinate data to the display device.

According to some embodiments, the light blocking layer has a light transmittivity of 20% or less at a wavelength of 380 nm.

According to some embodiments, the light blocking layer has a light transmittivity of 20% or less at a wavelength of 405 nm.

According to some embodiments, the reflective layer includes a first alignment film, a second alignment film on the first alignment film, and a liquid crystal layer between the first alignment film and the second alignment film and including cholesteric liquid crystals.

With a display device and a position input system according to some embodiments, it may be possible to prevent or reduce position detection performance of a position input device from being deteriorated by preventing or reducing code patterns from being deteriorated by ultraviolet light incident from the outside.

In addition, it may be possible to prevent or reduce deterioration of display quality by preventing or reducing light emitting layers of a display panel from being deteriorated by the ultraviolet light incident from the outside.

The characteristics of embodiments according to the present disclosure are not limited to the aforementioned characteristics, and various other characteristics are included in the specification.

BRIEF DESCRIPTION OF THE DRAWINGS

The above and other aspects and characteristics of embodiments according to the present disclosure will become more apparent by describing in more detail aspects of some embodiments thereof with reference to the attached drawings, in which.

DETAILED DESCRIPTION

Aspects of some embodiments of the present disclosure will now be described more fully hereinafter with reference to the accompanying drawings, in which aspects of some embodiments of the invention are shown. This invention may, however, be embodied in different forms and should not be construed as limited to the embodiments set forth herein. Rather, these embodiments are provided so that this disclosure will be thorough and complete, and will more fully convey the scope of embodiments according to the present invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

Each of the features of the various embodiments of the disclosure may be combined or combined with each other, in part or in whole, and technically various interlocking and driving are possible. Each embodiment may be implemented independently of each other or may be implemented together in an association.

Hereinafter, aspects of some embodiments will be described in more detail with reference to the accompanying drawings.

Figure 1:
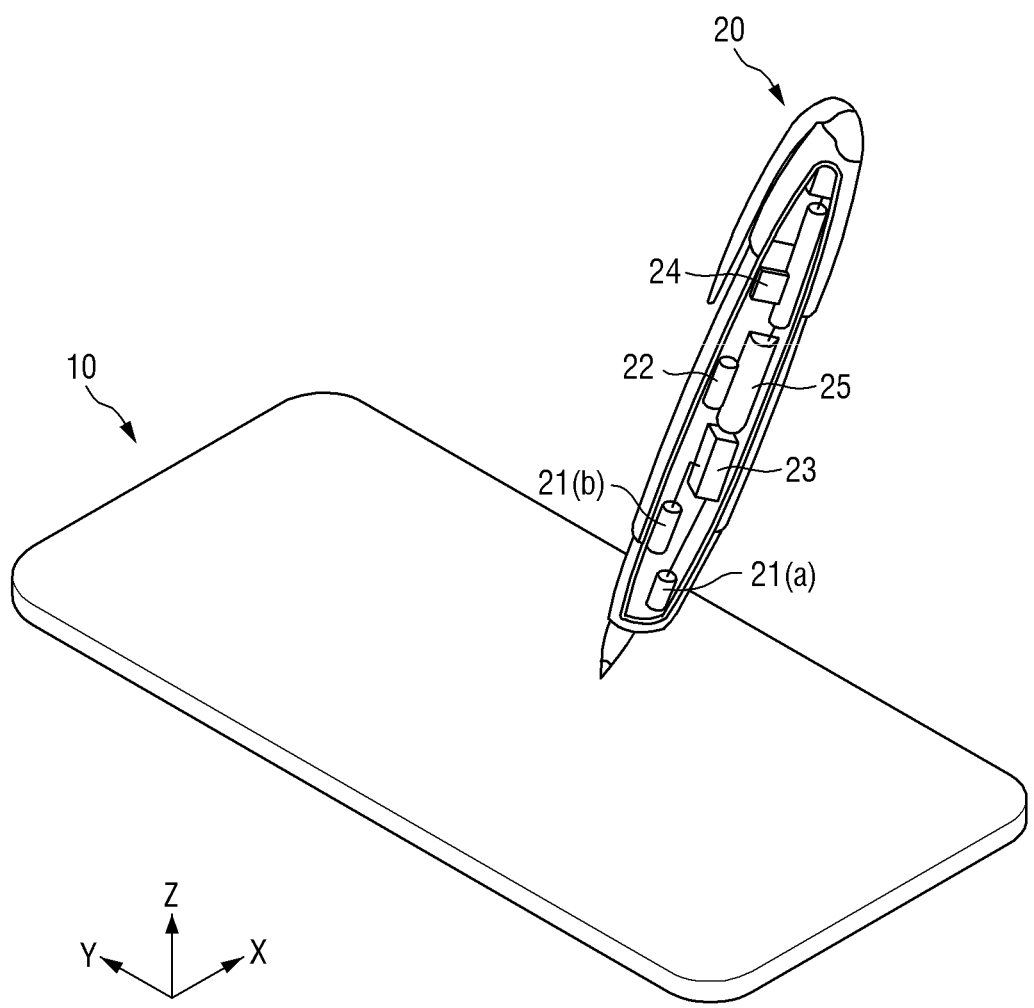
FIG. 1 is a view illustrating a configuration of a position input system according to some embodiments of the present disclosure.
Figure 2:
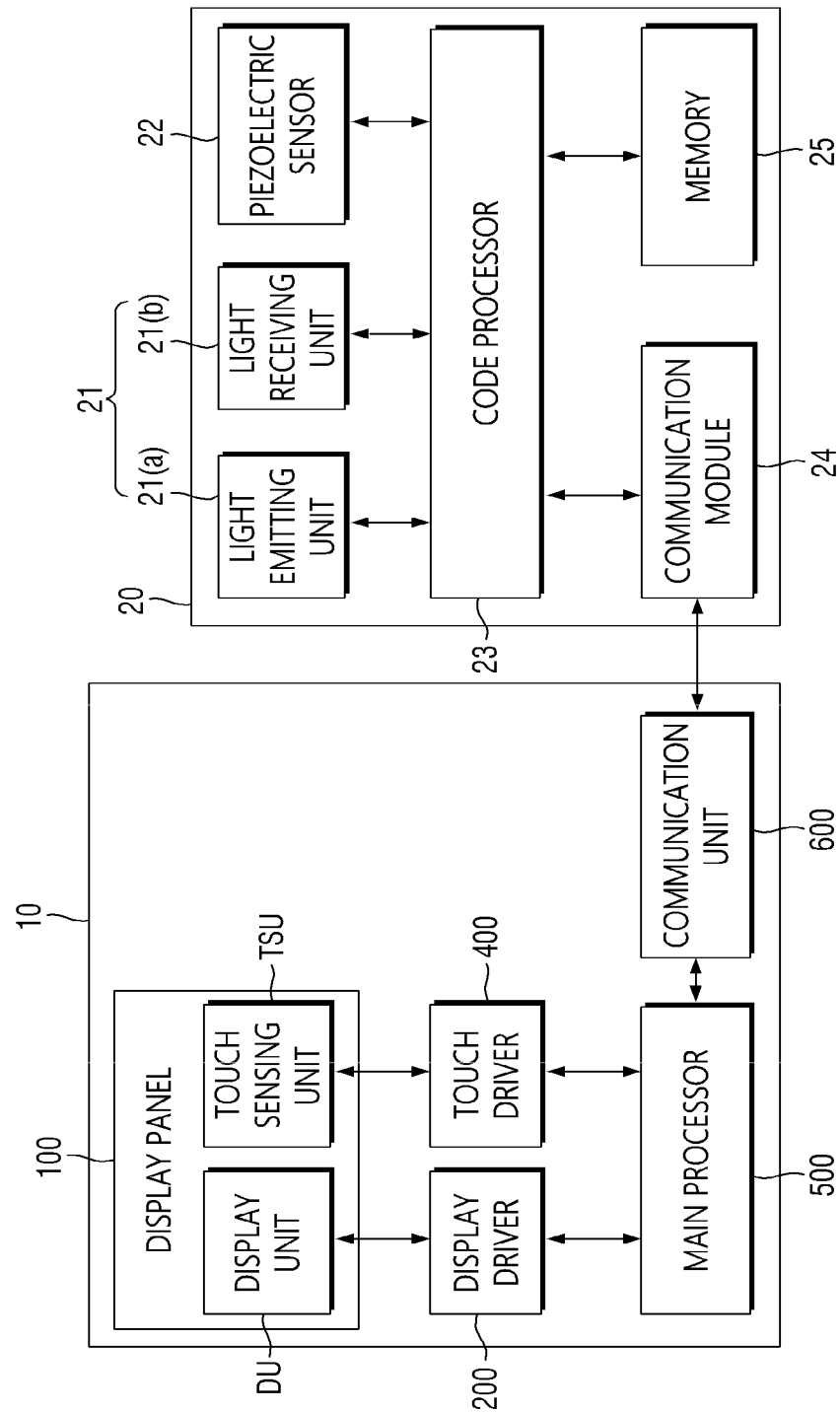
FIG. 2 is a block diagram illustrating aspects of a display device and a position input device illustrated in FIG. 1 according to some embodiments of the present disclosure.

FIG. 1 is a view illustrating a configuration of a position input system according to some embodiments of the present disclosure. FIG. 2 is a block diagram illustrating aspects of a display device and a position input device illustrated in FIG. 1.

Referring to FIGS. 1 and 2, a display device 10 may be applied to portable electronic devices such as mobile phones, smartphones, tablet personal computers (PCs), mobile communication terminals, electronic notebooks, electronic books, portable multimedia players (PMPs), navigation devices, and ultra mobile PCs (UMPCs). Alternatively, the display device 10 may be applied as a display unit of televisions, laptop computers, monitors, billboards, or the Internet of Things (IOTs). As another example, the display device 10 may be applied to wearable devices such as smart watches, watch phones, glasses-type displays, and head mounted displays (HMDs).

The display device 10 may be a light emitting display device such as an organic light emitting display device using an organic light emitting diode, a quantum dot light emitting display device including a quantum dot light emitting layer, an inorganic light emitting display device including an inorganic semiconductor, and a micro or nano light emitting display device using a micro or nano light emitting diode. Hereinafter, it will be mainly described that the display device 10 is the organic light emitting display device, but embodiments according to the present disclosure are not limited thereto.

The display device 10 includes a display panel 100, a display driver 200, a touch driver 400, a main processor 450, and a communication unit 600.

The display device 10 uses a position input device 20 such as an electronic pen as a position coordinate input means. The display panel 100 of the display device may include a display unit DU displaying an image and a touch sensing unit TSU sensing a touch of a user's body part such as a finger, a touch pen, and the like.

The display unit DU of the display panel 100 may include a plurality of unit pixels and display the image through the plurality of unit pixels. The touch sensing unit TSU may be mounted on and attached to a front surface portion of the display panel 100. The touch sensing unit TSU may include a plurality of touch electrodes, and may sense a touch of the user's body part, the touch pen, and the like, in a capacitive manner on a front surface of the display panel 100. Here, position code patterns are formed on some of the plurality of touch electrodes, and are sensed by the position input device 20.

The position code patterns of the display panel 100 are formed of light blocking members forming preset planar code shapes. Accordingly, the position code patterns are sensed by the position input device 20 according to planar code pattern shapes, sizes (or areas), and the like, of the light blocking members. The position code patterns formed of the light blocking members absorb or block external light incident on a front surface. However, an area in which the position code patterns are not formed may reflect external light incident on a reflective layer again.

The display driver 200 may output signals and voltages for driving the display unit DU of the display panel 100. The display driver 200 may supply data voltages to data lines. The display driver 200 may supply a source voltage to power lines and supply gate control signals to a gate driver.

The touch driver 400 may be connected to the touch sensing unit TSU. The touch driver 400 may supply touch driving signals to the plurality of touch electrodes of the touch sensing unit TSU and sense change amounts in capacitance between the plurality of touch electrodes. The touch driver 400 may determine whether or not a user's touch input has been performed and calculate touch coordinates, based on the change amounts in capacitance between the plurality of touch electrodes.

The main processor 450 may control all functions of the display device 10. For example, the main processor 450 may supply digital video data to the display driver 200 so that the display panel 100 displays the image. In addition, the main processor 450 may receive touch data from the touch driver 400 to decide user's touch coordinates, and then generate digital video data according to the user's touch coordinates or execute an application indicated by an icon displayed on the user's touch coordinates.

Meanwhile, the main processor 450 receives position coordinate data from the position input device 20 and decides a pointer or position coordinates of an arrangement direction of the position input device 20. In addition, the main processor 450 may generate digital video data according to the pointer or the arrangement position coordinates of the position input device 20 or execute an application or the like indicated by an icon displayed on the arrangement position coordinates of the position input device 20.

The communication unit 600 may perform wired/wireless communication with an external device. For example, the communication unit 600 may transmit and receive communication signals to and from a communication module 24 of the position input device 20. The communication unit 600 may receive the position coordinate data consisting of data codes from the position input device 20, and may provide the position coordinate data to the main processor 450.

The position input device 20 may be positioned in a front direction of the display panel 100 according to the use of a user. The position input device 20 detects the pointer or the arrangement position coordinates in the front direction of the display panel 100 by recognizing the position code patterns of the display panel 100 in the front direction of the display panel 100. For example, the position input device 20 senses light reflected from the position code patterns of the display panel 100 using an optical method. In addition, the position input device 20 may detect the position code patterns based on the sensed light, and generate the position coordinate data according to the position code patterns. Such a position input device 20 may be an electronic pen such as a smart pen having a writing instrument shape, but embodiments according to the present disclosure are not limited only to a writing instrument shape or structure.

For example, a position input device 20 includes a code detection unit 21, a piezoelectric sensor 22, a code processor 23, the communication module 24, and a memory 25.

The code detection unit 21 is located at a position adjacent to a nib portion of the position input device 20, and senses the position code patterns included in the display panel 100 of the display device 10. To this end, the code detection unit 21 includes a light emitting unit 21(a) emitting infrared light using at least one infrared light source, and a light receiving unit 21(b) detecting infrared light reflected from the position code patterns with an infrared camera.

At least one infrared light source included in the light emitting unit 21(a) may be configured as an infrared light emitting diode (LED) array having a matrix structure. In addition, the infrared camera of the light receiving unit 21(b) may include a filter cutting off wavelength bands other than infrared light and passing infrared light therethrough, a lens system focusing the infrared light passing through the filter, an optical image sensor converting an optical image formed by the lens system into an electrical image signal and outputting the electrical image signal, and the like. The optical image sensor may be configured as an array having a matrix structure like the infrared LED array, and may provide shape data of the position code patterns to the code processor 23 according to forms of the infrared light reflected from the position code patterns of the display unit DU. In this way, the code detection unit 21 of the position input device 20 may continuously detect the position code patterns included in the display unit DU according to user's control and movement, continuously generate the shape data of the position code patterns, and provide the shape data of the position code patterns to the code processor 23.

The code processor 23 may continuously receive the shape data of the position code patterns from the code detection unit 21. For example, the code processor 23 may continuously receive the shape data of the position code patterns, and may identify an arrangement structure and a shape of the position code patterns. The code processor 23 may extract or generate data codes corresponding to the arrangement structure and the shape of the position code patterns, and may combine the data codes with each other to extract or generate position coordinate data corresponding to the combined data codes. The code processor 23 may transmit the generated position coordinate data to the display device 10 through the communication module 24. In particular, the code processor 23 may receive the shape data of the position code patterns and generate and convert data codes each corresponding to the position code patterns to quickly generate coordinate data without complicated calculation and correction.

The communication module 24 may perform wired/wireless communication with an external device. For example, the communication module 24 may transmit and receive communication signals to and from the communication unit 600 of the display device 10. The communication module 24 may receive the position coordinate data consisting of the data codes from the code processor 23, and may provide the position coordinate data to the communication unit 600.

The memory 25 may store data required for driving the position input device 20. The memory 25 stores shape data of the position code patterns and data codes each corresponding to the respective shape data and position code patterns. In addition, the memory 25 stores data codes and position coordinate data according to a combination of data codes. The memory 25 shares data codes each corresponding to the respective shape data and position code patterns, and position coordinate data according to a combination of data codes with the code processor 23. Accordingly, the code processor 23 may combine the data codes with each other through the data codes and the position coordinate data stored in the memory 25, and may extract or generate position coordinate data corresponding to the combined data codes.

Figure 3:
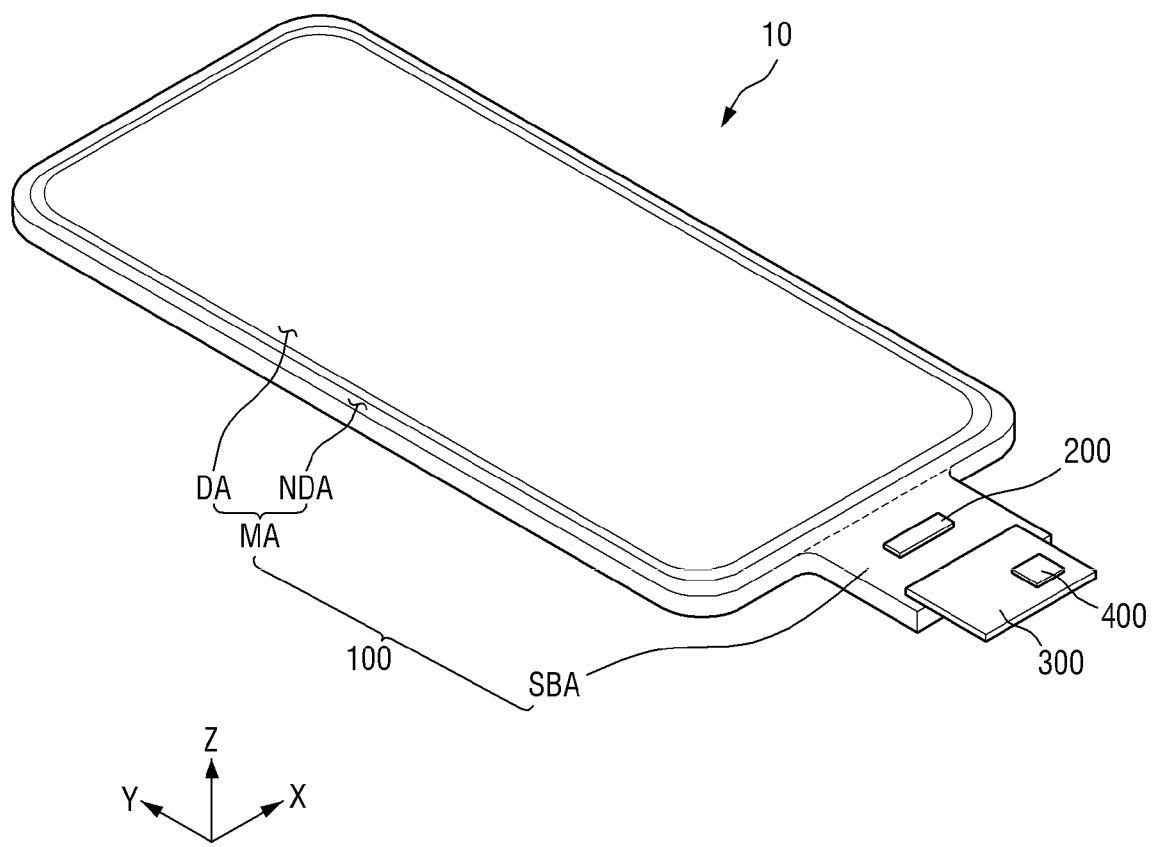
FIG. 3 is a perspective view illustrating aspects of a configuration of the display device illustrated in FIG. 1 according to some embodiments of the present disclosure.
Figure 4:
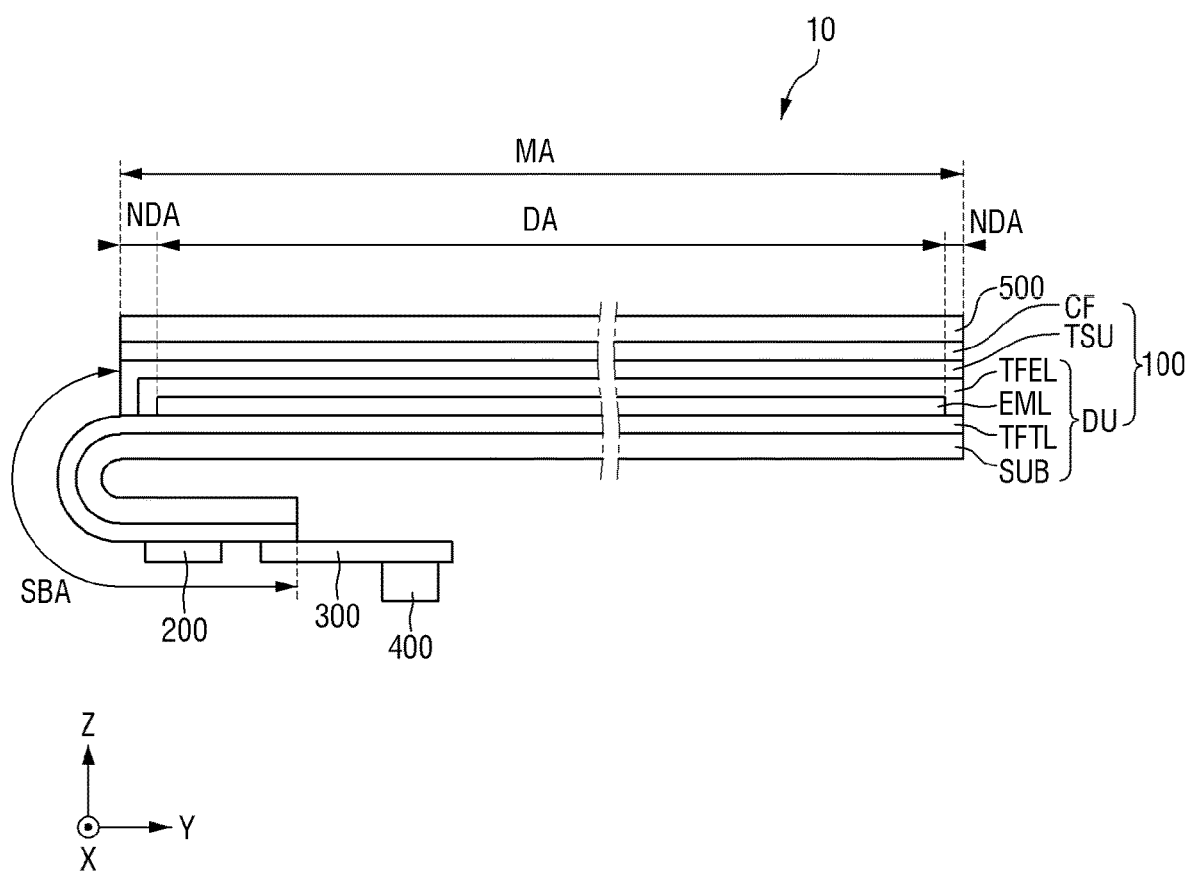
FIG. 4 is a cross-sectional view illustrating aspects of the configuration of the display device illustrated in FIGS. 1 and 3 according to some embodiments of the present disclosure.

FIG. 3 is a perspective view illustrating aspects of a configuration of the display device illustrated in FIG. 1 according to some embodiments. FIG. 4 is a cross-sectional view illustrating aspects of the configuration of the display device illustrated in FIGS. 1 and 3 according to some embodiments.

Referring to FIGS. 3 and 4, the display device 10 may have a shape similar to a rectangular shape, in plan view. For example, the display device 10 may have a shape similar to a rectangular shape, in plan view, having short sides in an X-axis direction and long sides in a Y-axis direction. A corner where the short side in the X-axis direction and long sides in the Y-axis direction meet may be rounded with a curvature (e.g., a set or predetermined curvature) or may be right-angled. The shape of the display device 10 in a plan view is not limited to the rectangular shape, and may be a shape similar to other polygonal shapes, a circular shape, or an elliptical shape. The display panel 100 may be formed to be flat, but embodiments according to the present disclosure are not limited thereto. For example, the display panel 100 includes curved surface parts formed at left and right ends thereof and having a constant curvature or a variable curvature. The display panel 100 may be flexibly formed to be bent, folded, or rolled.

The display panel 100 may include a main area MA and a sub-area SBA. The main area MA includes a display area DA displaying an image and a non-display area NDA which is a peripheral area of the display area DA. The display area DA may emit light from a plurality of unit pixels and a plurality of opening areas (or emission areas) corresponding to the respective unit pixels. The display panel 100 may include pixel circuits including switching elements, a pixel defining film defining the emission areas or the opening areas, and self-light emitting elements. The non-display area NDA may be an area outside the display area DA. The non-display area NDA may be defined as an edge area of the main area MA of the display panel 100. The non-display area NDA may include a gate driver supplying gate signals to gate lines, and fan-out lines connecting the display driver 200 and the display area DA to each other.

The plurality of unit pixels are arranged in first and second directions (X-axis and Y-axis directions) in the display area DA of the display panel 100, and each unit pixel includes a plurality of sub-pixels. The plurality of unit pixels display an image using the plurality of sub-pixels. The plurality of sub-pixels may be arranged in a PenTile™ matrix structure. Alternatively, the plurality of sub-pixels may be arranged in a vertical or horizontal stripe structure. The display area DA in which the plurality of unit pixels are arranged may occupy most of the main area MA.

The sub-area SBA may extend from one side of the main area MA. The sub-area SBA may include a flexible material that may be bent, folded, and rolled. For example, when the sub-area SBA is bent, the sub-area SBA may overlap the main area MA in a thickness direction (Z-axis direction). The sub-area SBA may include the display driver 200 and pad parts connected to a circuit board 300. Alternatively, the sub-area SBA may be omitted, and the display driver 200 and the pad parts may be located in the non-display area NDA.

The display driver 200 may be formed as an integrated circuit (IC) and be mounted on the display panel 100 in a chip on glass (COG) manner, a chip on plastic (COP) manner, or an ultrasonic bonding manner. As an example, the display driver 200 may be located in the sub-area SBA, and may overlap the main area MA in the thickness direction (Z-axis direction) by bending of the sub-area SBA. As another example, the display driver 200 may be mounted on the circuit board 300.

The circuit board 300 may be attached onto the pad parts of the display panel 100 using an anisotropic conductive film (ACF). Lead lines of the circuit board 300 may be electrically connected to the pad parts of the display panel 100. The circuit board 300 may be a flexible printed circuit board, a printed circuit board, or a flexible film such as a chip on film.

The touch driver 400 may be mounted on the circuit board 300. The touch driver 400 may be formed as an integrated circuit (IC). As described above, the touch driver 400 may supply the touch driving signals to the plurality of touch electrodes of the touch sensing unit TSU and sense the change amounts in capacitance between the plurality of touch electrodes. Here, the touch driving signal may be a pulse signal having a frequency (e.g., a set or predetermined frequency). The touch driver 400 may determine whether or not a touch input by a user's body part such as a finger has been performed and calculate touch coordinates, based on the change amounts in capacitance between the plurality of touch electrodes.

Referring to FIG. 4, the display device 10 may include the display panel 100 and a stacked structure 500 located on the display panel 100. The display panel 100 may include the display unit DU, the touch sensing unit TSU, and a color filter unit CF in cross-section. The display unit DU may include a substrate SUB, a thin film transistor layer TFTL, a light emitting element layer EML, and an encapsulation layer TFEL.

The substrate SUB1may be a base substrate or a base member. The substrate SUB1may be a flexible substrate that may be bent, folded, or rolled. As an example, the substrate SUB1may include a glass material or a metal material, but embodiments according to the present disclosure are not limited thereto. As another example, the substrate SUB1may include a polymer resin such as polyimide (PI).

The thin film transistor layer TFTL may be located on the substrate SUB. The thin film transistor layer TFTL may include a plurality of thin film transistors constituting pixel circuits of pixels. The thin film transistor layer TFTL may further include gate lines, data lines, power lines, gate control lines, fan-out lines connecting the display driver 200 and the data lines to each other, and lead lines connecting the display driver 200 and the pad parts to each other. When the gate driver is formed on one side of the non-display area NDA of the display panel 100, the gate driver may also include thin film transistors.

The thin film transistor layer TFTL may be located in the display area DA, the non-display area NDA, and the sub-area SBA. The thin film transistors of each of the pixels, the gate lines, the data lines, and the power lines of the thin film transistor layer TFTL may be located in the display area DA. The gate control lines and the fan-out lines of the thin film transistor layer TFTL may be located in the non-display area NDA. The lead lines of the thin film transistor layer TFTL may be located in the sub-area SBA.

The light emitting element layer EML may be located on the thin film transistor layer TFTL. The light emitting element layer EML may include a plurality of light emitting elements in which a first electrode, a light emitting layer, and a second electrode are sequentially stacked to emit light and a pixel defining film defining pixels. The plurality of light emitting elements of the light emitting element layer EML may be located in the display area DA. The light emitting layer may be an organic light emitting layer including an organic material. When the first electrode receives a voltage (e.g., a set or predetermined voltage) through the thin film transistor of the thin film transistor layer (TFTL) and the second electrode receives a cathode voltage, holes and electrons may move to the organic light emitting layer through a hole transporting layer and an electron transporting layer, respectively, and may be combined with each other in the organic light emitting layer to emit light. For example, the first electrode may be an anode electrode and the second electrode may be a cathode electrode, but embodiments according to the present disclosure are not limited thereto.

As another example, the plurality of light emitting elements may include quantum dot light emitting diodes including a quantum dot light emitting layer or inorganic light emitting diodes including an inorganic semiconductor.

The encapsulation layer TFEL may cover an upper surface and side surfaces of the light emitting element layer EML, and may protect the light emitting element layer EML. The encapsulation layer TFEL may include at least one inorganic film and at least one organic film for encapsulating the light emitting element layer EML.

The touch sensing unit TSU may be located on the encapsulation layer TFEL. The touch sensing unit TSU may include a plurality of touch electrodes for sensing a user's touch in a capacitive manner and touch lines connecting the plurality of touch electrodes and the touch driver 400 to each other. As an example, the touch sensing unit TSU may sense the user's touch using a self-capacitance manner or a mutual capacitance manner. As another example, the touch sensing unit TSU may be located on a separate substrate located on the display unit DU. In this case, the substrate supporting the touch sensing unit TSU may be a base member encapsulating the display unit DU.

The plurality of touch electrodes of the touch sensing unit TSU may be located in a touch sensor area overlapping the display area DA. The touch lines of the touch sensing unit TSU may be located in a touch peripheral area overlapping the non-display area NDA.

The color filter unit CF may be located on the touch sensing unit TSU. The color filter unit CF may improve a color purity of light emitted from each unit pixel and block ultraviolet light incident from the outside to prevent deterioration of the light emitting layer of the light emitting element layer EML.

The stacked structure 500 may be located on the color filter unit CF. The stacked structure 500 may include a first coupling member, a second coupling member, a reflective layer, a code pattern part, and a light blocking layer. A detailed description of these components will be provided later.

The sub-area SBA of the display panel 100 may extend from one side of the main area MA. The sub-area SBA may include a flexible material that may be bent, folded, and rolled. For example, when the sub-area SBA is bent, the sub-area SBA may overlap the main area MA in the thickness direction (Z-axis direction). The sub-area SBA may include the display driver 200 and pad parts connected to a circuit board 300.

Figure 5:
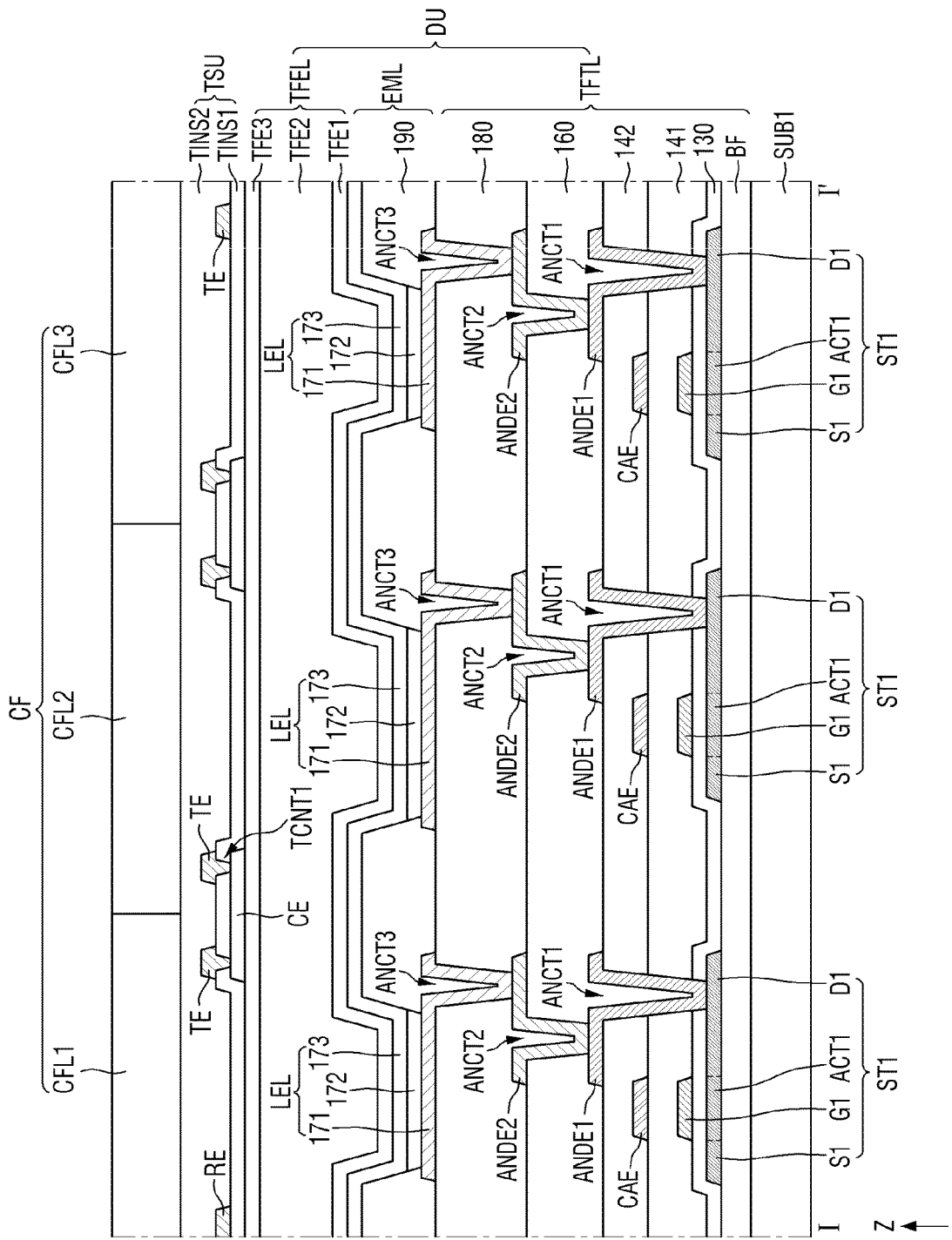
FIG. 5 is a schematic cross-sectional view illustrating a display panel according to some embodiments of the present disclosure.

FIG. 5 is a schematic cross-sectional view illustrating a display panel according to some embodiments.

Referring to FIG. 5, a buffer layer BF may be located on a substrate SUB. The substrate SUB1may be made of an insulating material such as a polymer resin. For example, the substrate SUB1may be made of polyimide. The substrate SUB1may be a flexible substrate that may be bent, folded, and rolled.

The buffer layer BF is a film for protecting transistors of a thin film transistor layer TFTL and light emitting layers 172 of a light emitting element layer EML from moisture or impurities permeating through the substrate SUB1vulnerable to moisture permeation. The buffer layer BF may include a plurality of inorganic films that are alternately stacked. For example, the buffer layer BF may be formed as multiple films in which one or more inorganic films of a silicon nitride layer, a silicon oxynitride layer, a silicon oxide layer, a titanium oxide layer, and an aluminum oxide layer are alternately stacked.

Thin film transistors ST1 may be located on the buffer layer BF. Each of the thin film transistors ST1 may include an active layer ACT1, a gate electrode G1, a source electrode S1, and a drain electrode D1.

The active layer ACT1 may include polycrystalline silicon, single crystal silicon, low-temperature polycrystalline silicon, amorphous silicon, or an oxide semiconductor. The active layer ACT1 overlapping the gate electrode G1 in a third direction (Z-axis direction), which is a thickness direction of the substrate SUB, may be defined as a channel region. The source electrode S1 and the drain electrode D1 are regions that do not overlap the gate electrode G1 in the third direction (Z-axis direction), and may have conductivity by doping a silicon semiconductor or an oxide semiconductor with ions or impurities.

A gate insulating layer 130 may be located on the active layer ACT1, the source electrode S1, and the drain electrode D1 of each of the thin film transistors ST1. The gate insulating layer 130 may be formed as an inorganic film, for example, a silicon nitride layer, a silicon oxynitride layer, a silicon oxide layer, a titanium oxide layer, or an aluminum oxide layer.

The gate electrode G1 of the thin film transistor ST1 may be located on the gate insulating layer 130. The gate electrode G1 may overlap the active layer ACT1 in the third direction (Z-axis direction). The gate electrode G1 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A first interlayer insulating layer 141 may be located on the gate electrode G1 of the thin film transistor ST1. The first interlayer insulating layer 141 may be formed as an inorganic film, for example, a silicon nitride layer, a silicon oxynitride layer, a silicon oxide layer, a titanium oxide layer, or an aluminum oxide layer. The first interlayer insulating layer 141 may be formed as a plurality of inorganic films.

A capacitor electrode CAE may be located on the first interlayer insulating layer 141. The capacitor electrode CAE may overlap the gate electrode G1 of the first thin film transistor ST1 in the third direction (Z-axis direction). Because the first interlayer insulating layer 141 has a dielectric constant (e.g., a set or predetermined dielectric constant), a capacitor may be formed by the capacitor electrode CAE, the gate electrode G1, and the first interlayer insulating layer 141 located between the capacitor electrode CAE and the gate electrode G1. The capacitor electrode CAE may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A second interlayer insulating layer 142 may be located on the capacitor electrode CAE. The second interlayer insulating layer 142 may be formed as an inorganic film, for example, a silicon nitride layer, a silicon oxynitride layer, a silicon oxide layer, a titanium oxide layer, or an aluminum oxide layer. The second interlayer insulating layer 142 may be formed as a plurality of inorganic films.

A first anode connection electrode ANDE1 may be located on the second interlayer insulating layer 142. The first anode connection electrode ANDE1 may be connected to the drain electrode D1 of the thin film transistor ST1 through a first connection contact hole ANCT1 penetrating through the gate insulating layer 130, the first interlayer insulating layer 141, and the second interlayer insulating layer 142. The first anode connection electrode ANDE1 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A first planarization layer 160 for planarizing a step due to the thin film transistor ST1 may be located on the first anode connection electrode ANDE1. The first planarization layer 160 may be formed as an organic film made of an acrylic resin, an epoxy resin, a phenolic resin, a polyamide resin, a polyimide resin, or the like.

A second anode connection electrode ANDE2 may be located on the first planarization layer 160. The second anode connection electrode ANDE2 may be connected to the first anode connection electrode ANDE1 through a second connection contact hole ANCT2 penetrating through the first planarization layer 160. The second anode connection electrode ANDE2 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A second planarization layer 180 may be located on the second anode connection electrode ANDE2. The second planarization layer 180 may be formed as an organic film made of an acrylic resin, an epoxy resin, a phenolic resin, a polyamide resin, a polyimide resin, or the like.

Light emitting elements LEL and a bank 190 may be located on the second planarization layer 180. Each of the light emitting elements LEL may include a pixel electrode 171, a light emitting layer 172, and a common electrode 173.

The pixel electrode 171 may be located on the second planarization layer 180. The pixel electrode 171 may be connected to the second anode connection electrode ANDE2 through a third connection contact hole ANCT3 penetrating through the second planarization layer 180. In a top emission structure in which light is emitted toward the common electrode 173 based on the light emitting layer 172, the pixel electrode 171 may be formed of a metal material having high reflectivity, such as a stacked structure (Ti/Al/Ti) of aluminum and titanium, a stacked structure (ITO/Al/ITO) of aluminum and indium tin oxide (ITO), an APC alloy, and a stacked structure (ITO/APC/ITO) of an APC alloy and ITO. The APC alloy is an alloy of silver (Ag), palladium (Pd), and copper (Cu).

The bank 190 may be formed to partition the pixel electrodes 171 on the second planarization layer 180 in order to define respective emission areas. The bank 190 may be arranged to cover an edge of the pixel electrode 171. The bank 190 may be formed as an organic film made of an acrylic resin, an epoxy resin, a phenolic resin, a polyamide resin, a polyimide resin, or the like.

The pixel electrode 171, the light emitting layer 172, and the common electrode 173 may be sequentially stacked, and holes from the pixel electrode 171 and electrons from the common electrode 173 may be combined with each other in the light emitting layer 172 to emit light.

The light emitting layer 172 may be located on the pixel electrode 171 and the bank 190. The light emitting layer 172 may include an organic material to emit light of a color (e.g., a set or predetermined color). For example, the light emitting layer 172 may include at least an organic light emitting layer, and may include one or more of a hole injection layer, a hole transport layer, an electron transport layer, and an electron injection layer.

The common electrode 173 may be located on the light emitting layer 172. The common electrode 173 may be arranged to cover the light emitting layer 172. The common electrode 173 may be a common layer formed in common in the respective emission areas.

In the top emission structure, the common electrode 173 may be formed of a transparent conductive material (TCO) such as ITO or indium zinc oxide (IZO) capable of transmitting light therethrough or a semi-transmissive conductive material such as magnesium (Mg), silver (Ag), or an alloy of magnesium (Mg) and silver (Ag). When the common electrode 173 is formed of the semi-transmissive conductive material, emission efficiency may be increased by a micro cavity.

An encapsulation layer TFEL may be located on the common electrode 173. The encapsulation layer TFEL includes at least one inorganic film in order to prevent oxygen or moisture from permeating into the light emitting element layer EML. In addition, the encapsulation layer TFEL includes at least one organic film in order to protect the light emitting element layer EML from foreign materials such as dust. For example, the encapsulation layer TFEL includes a first encapsulation inorganic film TFE1, an encapsulation organic film TFE2, and a second encapsulation inorganic film TFE3.

The first encapsulation inorganic film TFE1 may be located on the common electrode 173, the encapsulation organic film TFE2 may be located on the first encapsulation inorganic film TFE1, and the second encapsulation inorganic film TFE3 may be located on the encapsulation organic film TFE2. The first encapsulation inorganic film TFE1 and the second encapsulation inorganic film TFE3 may be formed as multiple films in which one or more inorganic films of a silicon nitride layer, a silicon oxynitride layer, a silicon oxide layer, a titanium oxide layer, and an aluminum oxide layer are alternately stacked. The encapsulation organic film TFE2 may be an organic film made of an acrylic resin, an epoxy resin, a phenolic resin, a polyamide resin, a polyimide resin, or the like.

A touch sensing unit TSU may be located on the encapsulation layer TFEL. The touch sensing unit TSU includes a first touch insulating film TINS1, connection electrodes CE, a second touch insulating film TINS2, driving electrodes TE, and sensing electrodes RE.

The first touch insulating film TINS1 may be formed as an inorganic film, for example, a silicon nitride layer, a silicon oxynitride layer, a silicon oxide layer, a titanium oxide layer, or an aluminum oxide layer.

The connection electrode CE may be located on the encapsulation layer TFEL. The connection electrode CE may connect driving electrodes TE or sensing electrodes RE to be described later to each other. The connection electrode CE may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

The first touch insulating film TINS1 may be located on the connection electrode CE. The first touch insulating film TINS1 may be formed as an inorganic film, for example, a silicon nitride layer, a silicon oxynitride layer, a silicon oxide layer, a titanium oxide layer, or an aluminum oxide layer. Alternatively, the first touch insulating film TINS1 may be formed as an organic film made of an acrylic resin, an epoxy resin, a phenolic resin, a polyamide resin, a polyimide resin, or the like.

The driving electrodes TE and the sensing electrodes RE may be located on the first touch insulating film TINS1. The driving electrodes TE and the sensing electrodes RE may be formed in a mesh structure or a net structure. Each of the driving electrodes TE and the sensing electrodes RE may partially overlap the connection electrode CE in the Z-axis direction. The driving electrode TE may be connected to the connection electrode CE through a touch contact hole TCNT1 penetrating through the first touch insulating film TINS1.

Each of the driving electrodes TE and the sensing electrodes RE may be formed as a single layer made of molybdenum (Mo), titanium (Ti), copper (Cu), or aluminum (Al) or be formed as a stacked structure (Ti/Al/Ti) of aluminum and titanium, a stacked structure (ITO/Al/ITO) of aluminum and ITO, an APC alloy, and a stacked structure (ITO/APC/ITO) of an APC alloy and ITO.

The second touch insulating film TINS2 may be located on the driving electrodes TE and the sensing electrodes RE. The second touch insulating film TINS2 may be a layer having insulating and optical functions. The second touch insulating film TINS2 may include at least one of an inorganic film and an organic film. The inorganic film may be a silicon nitride layer, a silicon oxynitride layer, a silicon oxide layer, a titanium oxide layer, or an aluminum oxide layer. The organic film may be made of an acrylic resin, an epoxy resin, a phenolic resin, a polyamide resin, or a polyimide resin.

A color filter unit CF may be located on the touch sensing unit TSU. The color filter unit CF may include first to third color filters CFL1, CFL2, and CFL3. For example, the first to third color filters CFL1, CFL2, and CFL3 may be located and formed in a planar shape on the second touch insulating film TINS2. The first color filter CFL1 may be arranged to correspond to a light emitting element LEL emitting light of a first color, the second color filter CFL2 may be arranged to correspond to a light emitting element LEL emitting light of a second color, and the third color filter CFL3 may be arranged to correspond to a light emitting element LEL emitting light of a third color.

Meanwhile, in the display device 10 according to some embodiments, the stacked structure 500 may be located on the display panel 100.

Figure 6:
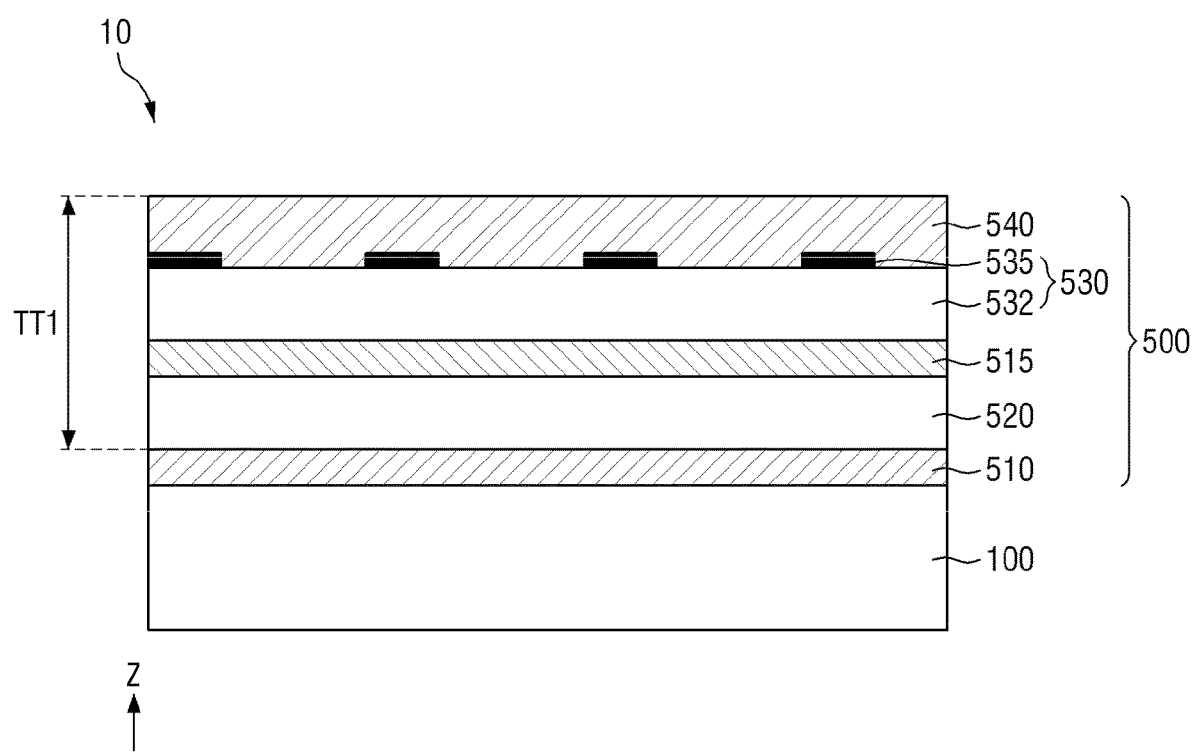
FIG. 6 is a schematic cross-sectional view illustrating the display device according to some embodiments of the present disclosure.
Figure 7:
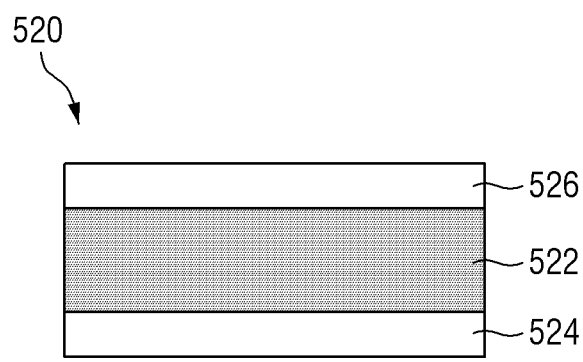
FIG. 7 is a schematic cross-sectional view illustrating a reflective layer of a stacked structure according to some embodiments of the present disclosure.
Figure 8:
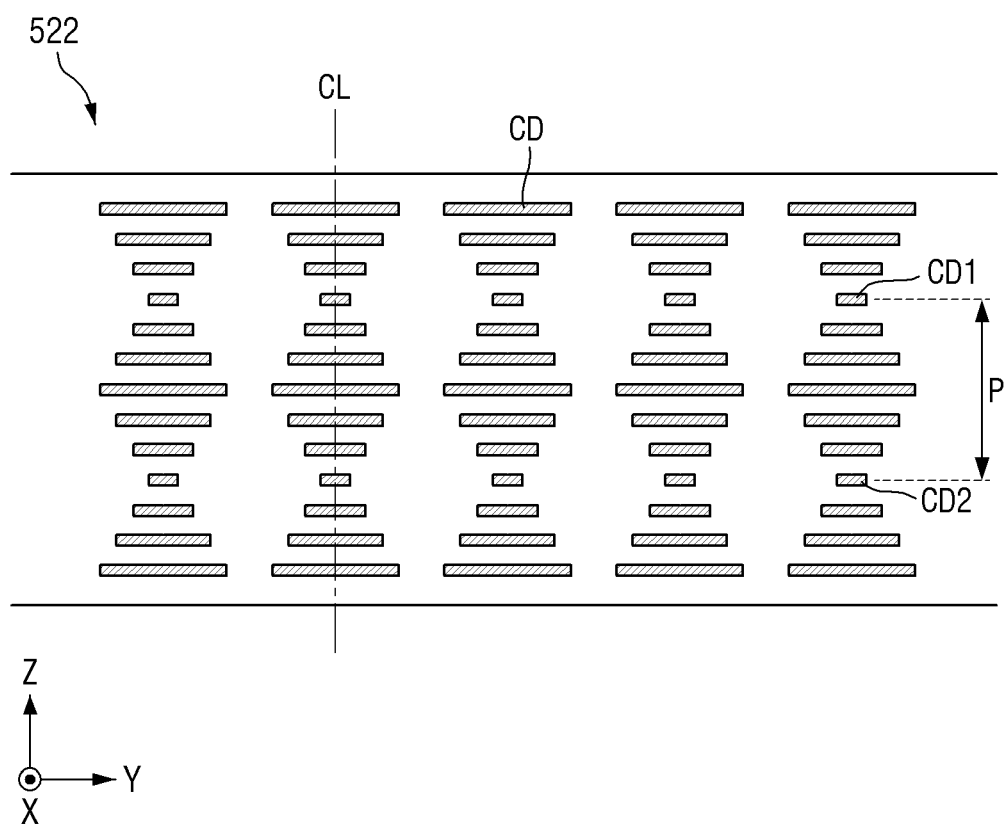
FIG. 8 is a schematic cross-sectional view illustrating a liquid crystal layer of the reflective layer according to some embodiments of the present disclosure.
Figure 9:
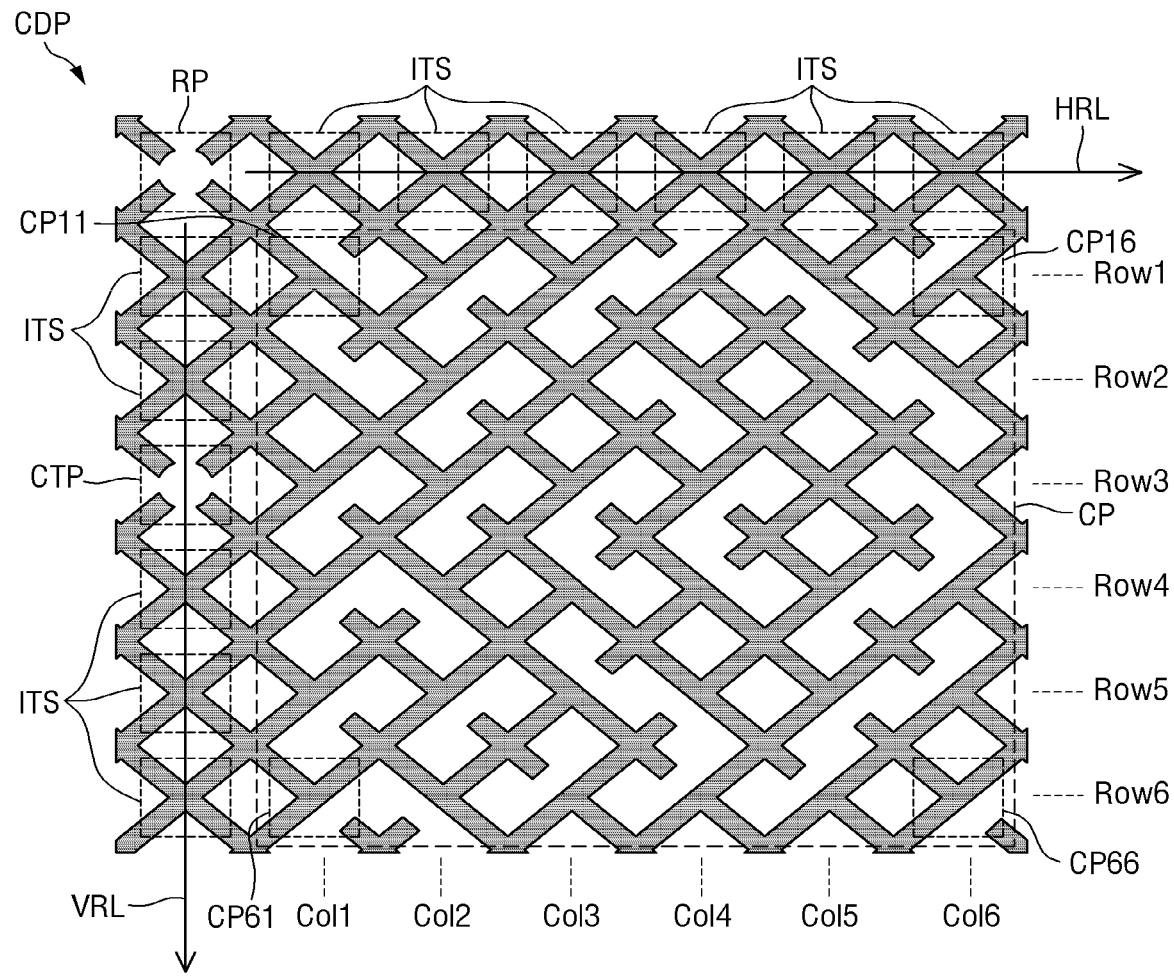
FIG. 9 is a schematic plan view illustrating a code pattern according to some embodiments of the present disclosure.
Figure 9:
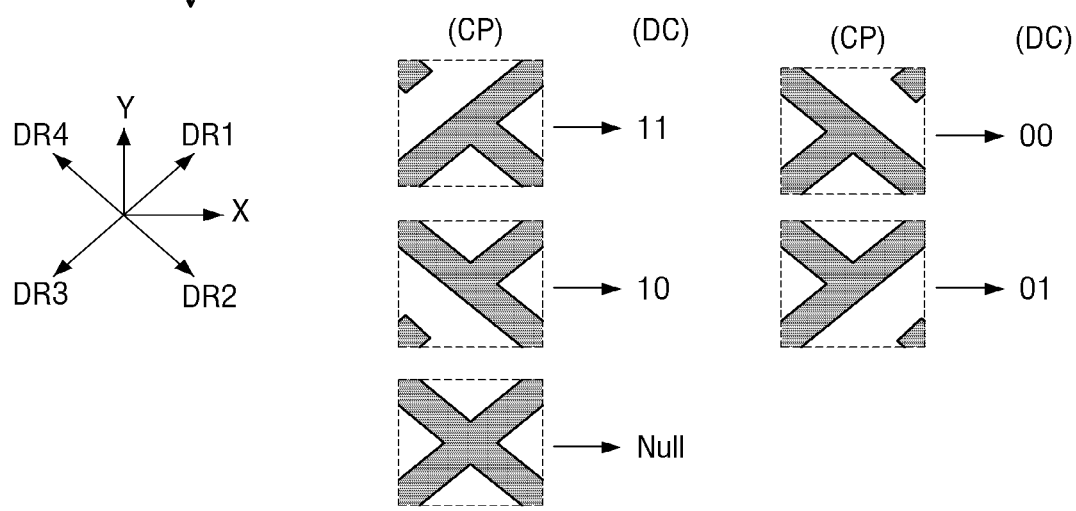
Figure 10:
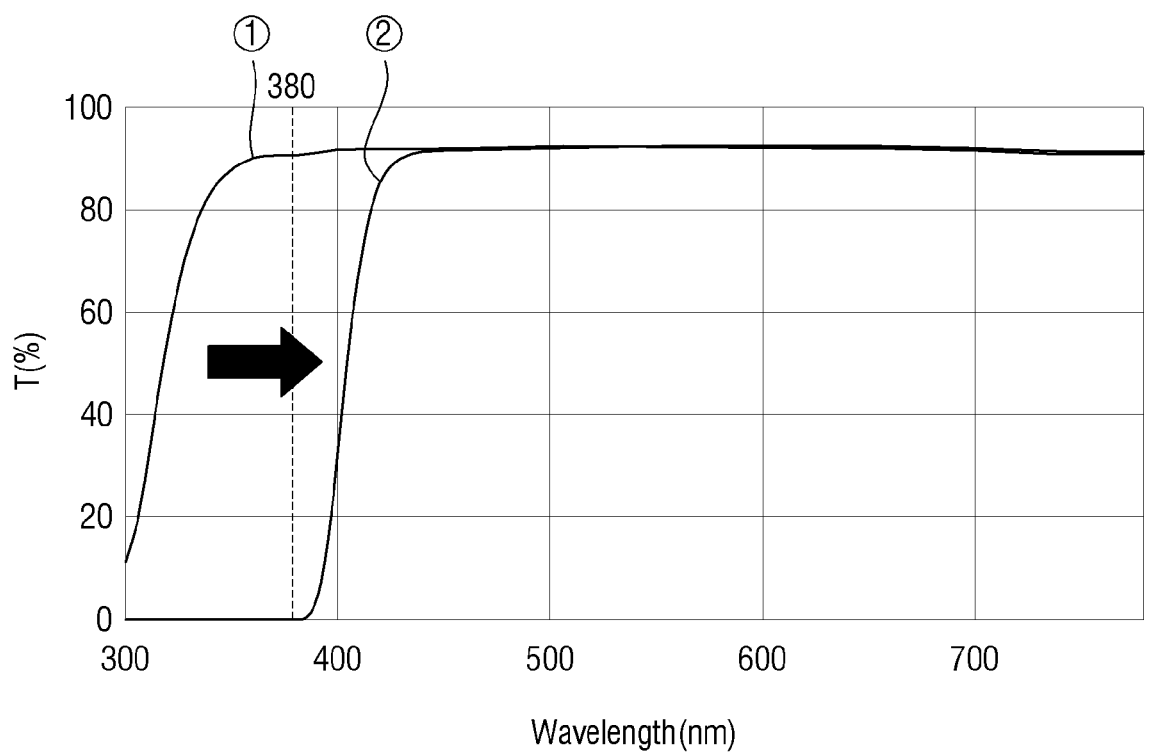
FIG. 10 is a graph illustrating a light transmittivity according to a wavelength band of a light blocking layer according to some embodiments of the present disclosure.

FIG. 6 is a schematic cross-sectional view illustrating the display device according to some embodiments. FIG. 7 is a schematic cross-sectional view illustrating a reflective layer of a stacked structure according to some embodiments. FIG. 8 is a schematic cross-sectional view illustrating a liquid crystal layer of the reflective layer according to some embodiments. FIG. 9 is a schematic plan view illustrating a code pattern according to some embodiments. FIG. 10 is a graph illustrating a light transmittivity according to a wavelength band of a light blocking layer.

Referring to FIGS. 6 to 9, the stacked structure 500 according to some embodiments may include a first coupling member 510, a reflective layer 520, a second coupling member 515, a code pattern part 530, and a light blocking layer 540.

The first coupling member 510 may be located on the display panel 100. The first coupling member 510 may adhere layers stacked on the first coupling member 510 onto one surface of the display panel 100. The first coupling member 510 may be a pressure sensitive adhesive (PSA).

The reflective layer 520 may be located on the first coupling member 510. The reflective layer 520 serves to reflect external light. For example, when the external light is incident on the display device 10, a portion of the external light may be reflected by the code pattern part 530, and a portion of the other light may be reflected by the reflective layer 520. In addition, the light reflected by the reflective layer 520 may be reflected again by the code pattern part 530. According to some embodiments, the position input device 20 may emit light of an infrared wavelength band to the display device 10, and the display device 10 may reflect the light of the infrared wavelength band. The position input device 20 (see FIG. 1) may detect a position by receiving the light of the infrared wavelength band. Accordingly, the reflective layer 520 may reflect the light of the infrared wavelength band, the reflected light may be sensed by the position input device 20 (see FIG. 1), and the position may be sensed.

The reflective layer 520 may be provided in the form of a film, and may be adhered to the display panel 100 by the first coupling member 510. The reflective layer 520 may include a liquid crystal layer 522. The liquid crystal layer 522 may be a cholesteric liquid layer. That is, the liquid crystal layer 522 includes chiral dopants inducing a periodic spiral structure in cholesteric liquid crystals CD. The cholesteric liquid crystal CD may be a chiral nematic liquid crystal. Optical properties of the liquid crystal layer 522 may be determined according to a rotation direction of the spiral structure in which the cholesteric liquid crystals CD are twisted and rotated.

The liquid crystal layer 522 has a spiral structure in which the chiral dopants (or liquid crystal molecules) of the cholesteric liquid crystals CD are arranged while forming layers while being twisted along spiral axes. A distance from a first chiral dopant CD1 to a second chiral dopant CD2 rotated by 360° in a spiral axis direction with respect to the first chiral dopant CD1 may be defined as a pitch P of the liquid crystal layer 522. That is, the pitch P may be a distance between the first chiral dopant CD1 and the second chiral dopant CD2 in the third direction Z. Alternatively, a spiral axis CL of the liquid crystal layer 522 may extend in the third direction Z, and the pitch P may be a distance between the first chiral dopant CD1 and the second chiral CD2 in the third direction Z on the spiral axis CL.

Accordingly, the cholesteric liquid crystals CD arranged in the spiral structure by the chiral dopants reflect light of a long wavelength as the pitch P becomes great, and reflect light of a short wavelength as the pitch P becomes small. That is, it is possible to determine which wavelength of light is reflected depending on how the pitch P of the cholesteric liquid crystals CD arranged in the spiral structure by the chiral dopants is designed. The pitch P of the cholesteric liquid crystals CD arranged in the spiral structure by the chiral dopants may be adjusted according to an amount of the chiral dopants.

The liquid crystal layer 522 transmits only some light polarized in a direction opposite to a rotation direction of a spiral and reflects the other light. A wavelength of the reflected light may be expressed as the product of an average refractive index of the cholesteric liquid crystals CD and the pitch P. Even though a liquid crystal composition is prepared in order to align the liquid crystal layer 522 having a desired pitch, a combination of liquid crystal molecules in a liquid crystal molecule group constituting the pitch is randomly determined, and thus, the liquid crystal molecule group is aligned so as to have a pitch in a range (e.g., a set or predetermined range). In addition, because each of the liquid crystal molecules has a refractive index within a range (e.g., a set or predetermined range) and the combination of the liquid crystal molecules constituting one pitch is randomly determined, an average refractive index of the liquid crystal molecule group constituting one pitch may be different for each pitch.

The liquid crystal layer 522 has a refractive index in a range (e.g., a set or predetermined range), and is aligned so as to have a pitch in a range (e.g., a set or predetermined range). As a refractive index range of the liquid crystal layer 522 becomes wide and a pitch range of the liquid crystal layer 522 becomes wide, the liquid crystal layer 522 may reflect light of a wide wavelength band. A wavelength band of reflected light of a liquid crystal molecule group constituting one pitch is determined as represented in Equation 1.

$$P = \frac{\lambda}{n} \qquad \text{Equation 1}$$

Here, P refers to the pitch of the cholesteric liquid crystals CD arranged in the spiral structure by the chiral dopants, λ refers to a reflection wavelength at which light is reflected, and n refers to the average refractive index of the cholesteric liquid crystals CD. For example, when the reflection wavelength (λ) is 780 nm and the average refractive index (n) of the cholesteric liquid crystals CD is 1.5, the pitch P of the cholesteric liquid crystals CD arranged in the spiral structure by the chiral dopants may be calculated to be 520 nm. In addition, when the reflection wavelength (λ) is 380 nm and the average refractive index (n) of the cholesteric liquid crystals CD is 1.5, the pitch P of the cholesteric liquid crystals CD arranged in the spiral structure by the chiral dopants may be calculated to be 253 nm. That is, when the refractive index (n) of the cholesteric liquid crystal (CD) is 1.5, the pitch P may be designed to be 253 nm or less or 520 nm or more so that the reflection wavelength (λ) of the cholesteric liquid crystals CD arranged in the spiral structure by the chiral dopants is 380 nm or less and 780 nm or more in order to reflect an infrared wavelength band (wavelength band of 780 nm or more) or an ultraviolet wavelength band (wavelength band of 380 nm or less).

In order to align the cholesteric liquid crystals CD in a more planar form, the reflective layer 520 may further include alignment films 524 and 526. For example, as illustrated in FIG. 7, the liquid crystal layer 522 may be aligned between a first alignment film 524 and a second alignment film 526. The alignment film may be a polyimide film, and the cholesteric liquid crystals may be aligned on the rubbed polyimide layer.

Meanwhile, the second coupling member 515 may be located on the reflective layer 520. The second coupling member 515 may serve to adhere the code pattern part 530 located thereon and the reflective layer 520 to each other. The second coupling member 515 may include a UV-curable resin such as an acrylic resin or an epoxy resin. The second coupling member 515 may have relatively rigid characteristics as compared with the first coupling member 510 to behave together with the code pattern part 530 and the reflective layer 520 coupled respectively to upper and lower surfaces of the second coupling member 515.

The code pattern part 530 may be located on the second coupling member 515. The code pattern part 530 may include code patterns cut according to a specific criterion in order to form a specific code for position information. The code pattern part 530 may include a base 532 and a plurality of code patterns 535 located on the base 532. The base 532 is a layer on which the code patterns 535 are formed, and may be a transparent substrate. For example, the base 532 may include polyethylene terephthalate (PET) or polyimide (PI).

The code pattern 535 may include a reference point RP, a first reference line HRL, and a second reference line VRL. The reference point RP may be an identification reference of the code pattern 535. For example, the reference point RP may correspond to an area in which an intersection point between at least some of the touch electrodes is cut. For example, the reference point RP may be located at the upper left end of the code pattern 535, but embodiments according to the present disclosure are not limited thereto.

The first reference line HRL may extend from the reference point RP in the first direction X. The first reference line HRL may be defined by connecting a plurality of intersection points ITS arranged in the X-axis direction of the reference point RP to each other. For example, when the first reference line HRL is defined by connecting six intersection points ITS to each other, a plurality of code patterns CP may be arranged along six columns including the six intersection points ITS.

The second reference line VRL may extend from the reference point RP in the Y-axis direction. The second reference line VRL may be defined by connecting a plurality of intersection points ITS arranged in the Y-axis direction of the reference point RP and a cut part CTP located between the plurality of intersection points ITS to each other. For example, the second reference line VRL may be defined by connecting two intersection points ITS, one cut part CTP, and three intersection points ITS to each other, and a plurality of code patterns CP. may be arranged along six rows including five intersection points ITS and one cut part CTP.

The code pattern 535 may be located in an area defined by the first reference line HRL and the second reference line VRL. A gradient or a rotation angle of the code pattern 535 with respect to a camera may be sensed by the first reference line HRL and the second reference line VRL. For example, when the first reference line HRL is defined by connecting the six intersection points ITS to each other and the second reference line VRL is defined by connecting the two intersection points ITS, the one cut part CTP, and the three intersecting points ITS to each other, the code patterns CP may be arranged in a 6×6 matrix (6 by 6 matrix). However, embodiments according to the present disclosure are not limited thereto, and the code pattern 535 may have various shapes. For example, the code pattern 535 may extend in the X-axis direction or the Y-axis direction. Alternatively, the code pattern 535 may have a shape in which it extends along some of sides of a rhombus. Alternatively, the code pattern 535 may have a shape such as a circular shape.

The code pattern 535 may be cut according to a specific criterion to have position information. The code pattern 535 may correspond to a value of a preset data code DC. For example, the code pattern 535 may be provided by cutting one of a plurality of stems extending from the intersection point between at least some of the touch electrodes. The plurality of stems of at least some of the touch electrodes may extend from the intersection point in first to fourth diagonal directions DR1, DR2, DR3, and DR4, and a stem extending in one of the first to fourth diagonal directions DR1, DR2, DR3, and DR4 may be cut. A direction in which the stem is cut may correspond to a value of the preset data code DC constituting the position information. For example, a code pattern 535 located in an m-th row (here, m is a natural number) and an n-th column (here, n is a natural number) may correspond to a data code DC located in the m-th row and the n-th column.

For example, a code pattern 535 in which a stem in the first diagonal direction DR1 is cut may correspond to a data code DC of [00]. A code pattern 535 in which a stem in the second diagonal direction DR2 is cut may correspond to a data code DC of [01]. A code pattern 535 in which a stem in the third diagonal direction DR3 is cut may correspond to a data code DC of [10]. A code pattern 535 in which a stem in the fourth diagonal direction DR4 is cut may correspond to a data code DC of [11].

An eleventh code pattern CP11 located in a first row Row1 and a first column Col1 may have a stem cut in the first diagonal direction DR1, and an eleventh data code DC11 may have a value of [00]. A sixty-first code pattern CP61 located in a sixth row Row6 and the first column Col1 may have a stem cut in the second diagonal direction DR2, and a sixty-first data code DC61 may have a value of [01]. A sixty-second code pattern CP62 located in the sixth row Row6 and a second column Col2 may have a stem cut in the third diagonal direction DR3, and a sixty-second data code DC62 may have a value of [10]. A sixteenth code pattern CP16 located in the first row Row1 and a sixth column Col6 may have a stem cut in the fourth diagonal direction DR4, and a sixteenth data code DC16 may have a value of [11].

The display device includes the above-described code pattern part 530, and may thus receive a touch input of a touch position input device such as the position input device 20 (see FIG. 1). The plurality of code patterns 535 may be cut according to a specific criterion to have position information, and may correspond to preset data codes DC in a one-to-one manner. Accordingly, the display device 10 may reduce cost, decrease power consumption, and simplify a driving process by receiving the coordinate data generated without complicated calculation and correction using the data codes DC.

Referring to FIG. 6 again, the light blocking layer 540 may be located on the code pattern part 530. The light blocking layer 540 may block light of a partial wavelength band among light incident from the outside. Infrared absorption components of the above-described code patterns 535 are deteriorated by light of an ultraviolet wavelength band among the light incident from the outside, such that position detection performance of the position input device may be deteriorated. In addition, the light emitting layers 172 of the display panel 100 may also be deteriorated by the light of the ultraviolet wavelength band, such that display quality may be deteriorated. According to some embodiments, the light blocking layer 540 may be located on the display panel 100 to prevent the deterioration of the code patterns 535 and the light emitting layers 172.

The light blocking layer 540 may be located directly on the code pattern part 530 to block the light of the partial wavelength band of the light incident from the outside from being incident on the code patterns 535 and the light emitting layers 172. The light blocking layer 540 may be located directly on the base 532 and the code patterns 535. For example, the light blocking layer 540 may be in direct contact with portions of an upper surface of the base 532, and may be in direct contact with side surfaces and upper surfaces of the code patterns 535.

The light blocking layer 540 may include a resin with which an ultraviolet absorber is mixed. According to some embodiments, the light blocking layer 540 may be formed by directly applying and curing the resin onto the code pattern part 530. The resin may be a polymer resin which may be transparent to transmit light therethrough, and with which an ultraviolet absorber may be mixed. For example, the resin may include polyethylene terephthalate (PET), polyester (PE), polycarbonate (PC), and the like. However, embodiments according to the present disclosure are not limited thereto.

The ultraviolet absorber may be any material that may absorb the light of the ultraviolet wavelength band. For example, the ultraviolet absorber may be a benzotriazole compounds such as a 2-(2'-hydroxyphenyl)-benzotriazole-based compound, for example, 2-(2'-hydroxy-5'-methylphenyl)benzotriazole, 2-(3',5'-di-tert-butyl-2'-hydroxyphenyl)benzotriazole, 2-(5'-tert-butyl-2'-hydroxyphenyl)benzotriazole, 2-(2-hydroxy-5-(1,1,3,3,tetramethylbutyl)phenyl)benzotriazole, 2-(3',5'-di-tert-butyl-2'-hydroxyphenyl)-5-benzotriazole, 2-(3'-tert-butyl-2'-hydroxyphenyl-5'-methylphenyl)-5-benzotriazole, 2-(3'-sec-butyl-5'-tert-butyl-2'-hydroxyphenyl)benzotriazole, 2-(2'-hydroxy-4'-octyloxyphenylphenyl)-5-benzotriazole or 2-(3',5'-di-tert-butyl-2'-hydroxyphenyl)benzotriazole; a benzophenone compound such as a 2-hydroxybenzophenone-based compound having a 4-hydroxy, 4-methoxy, 4-octyloxy, 4-decyloxy, 4-dodecyloxy, 4-benzyloxy, 4,2',4'-trihydroxy or 2'-hydroxy-4,4'-dimethoxy functional group; a benzoic acid ester compound such as a compound having a substituted benzoic acid ester structure, for example, 4-tert-butyl-phenyl salicylate, phenyl salicylate, octylphenyl salicylate, dibenzoyl resorcinol, bis(4-tert-butyl-benzoyl)resorcinol, benzoyl resorcinol, 2,4-di-tert-butylphenyl-3,5'-di-tert-butyl-4-hydroxybenzoate, hexadecyl 3,5-di-tert-butyl-4-4hydroxybenzoate, octadecyl 3,5-di-tert-butyl-4-hydroxybenzoate, or 2-methyl-4,6-di-tert-butylphenyl 3,5-di-tert-butyl-4-hydroxybenzoate; a triazine compound, or the like, but embodiments according to the present disclosure are not limited thereto.

In addition, the ultraviolet absorber may include at least one of compounds represented by Chemical Formula 1 or 2.

Chemical Formula 1

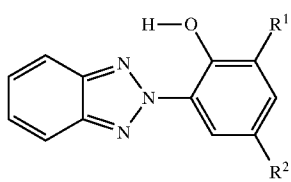

Chemical Formula 2

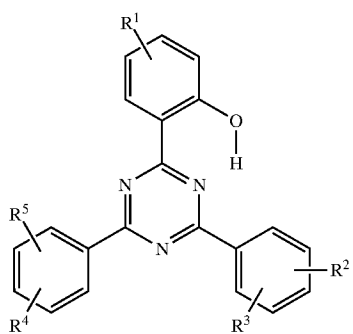

$R^1$ to $R^5$ are each independently hydrogen, an alkyl group, a cycloalkyl group, an aryl group, an acylamino group, an alkylthio group, an arylthio group, an alkenyl group, a halogen atom, an alkynyl group, a heterocyclic group, an alkylsulfonyl group, an arylsulfonyl group, an akylsulfinyl group, an arylsulfinyl group, a phosphono group, an acyl group, a carbamoyl group, a sulfamoyl group, a sulfonamide group, a cyano group, an alkoxy group, an aryloxy group, a heterocyclic oxy group, a siloxy group, an acyloxy group, a sulfonic acid group, a salt of a sulfonic acid, an aminocarbonyloxy group, an amino group, an anilino group, an imide group, a ureide group, an alkoxycarbonylamino group, an alkoxycarbonyl group, an aryloxycarbonyl group, a heterocyclic thio group, a thiourea group, a carboxyl group, a salt of a carboxylic acid, a hydroxyl group, a mercapto group, or a nitro group.

In addition, the ultraviolet absorber may further include a compound represented by the Chemical Formula 3.

Chemical Formula 3

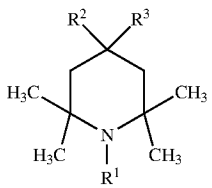

$R^1$ to $R^3$ are each independently hydrogen, an alkyl group, a cycloalkyl group, an aryl group, an acylamino group, an alkylthio group, an arylthio group, an alkenyl group, a halogen atom, an alkynyl group, a heterocyclic group, an alkylsulfonyl group, an arylsulfonyl group, an akylsulfinyl group, an arylsulfinyl group, a phosphono group, an acyl group, a carbamoyl group, a sulfamoyl group, a sulfonamide group, a cyano group, an alkoxy group, an aryloxy group, a heterocyclic oxy group, a siloxy group, an acyloxy group, a sulfonic acid group, a salt of a sulfonic acid, an aminocarbonyloxy group, an amino group, an anilino group, an imide group, a ureide group, an alkoxycarbonylamino group, an alkoxycarbonyl group, an aryloxycarbonyl group, a heterocyclic thio group, a thiourea group, a carboxyl group, a salt of a carboxylic acid, a hydroxyl group, a mercapto group, or a nitro group.

Referring to FIG. 10, the light blocking layer 540 may include the above-described ultraviolet absorber to absorb the light of the ultraviolet wavelength band among the light incident from the outside. In a polyethylene terephthalate film ① that does not include the ultraviolet absorber, a light transmittivity at a wavelength of 380 nm is 90%, whereas in the light blocking layer ② including the ultraviolet absorber, a light transmittivity at a wavelength of 380 nm is 0%. The light blocking layer 540 according to some embodiments may block ultraviolet light in order to prevent the deterioration of the code patterns 535 and the light emitting layers 172. For example, the light blocking layer 540 may have a light transmittivity of 20% or less at a wavelength of 380 nm. According to some embodiments, the light blocking layer 540 may have a light transmittivity of 20% or less at a wavelength of 405 nm. According to some embodiments, the light blocking layer 540 may not reduce a light transmittivity of a visible light wavelength band so as not to affect image quality of the display panel 100.

According to some embodiments, the stacked structure 500 may have a thickness (e.g., a set or predetermined thickness) in order to implement a foldable display device 10. In a case of the foldable display device, folding and unfolding operations should be possible using a flexible display panel. A buckling resistance index represented by the following Relational Expression represents buckling resistance according to a thickness, a modulus, and the like of a film.

Relational Expression $$B \cdot R \cdot I = \frac{\pi^2 E h^2}{12(kL)^2 \sigma}$$

Here, B.R.I refers to the buckling resistance index, h refers to the thickness of the film, E refers to the modulus of the film, kL refers to an effective length, and a refers to buckling critical stress.

Like the buckling resistance index, the thickness of the film acts as a factor that increases a value of the buckling resistance by a square, and thus has a great influence on the implementation of the foldable display device.

According to some embodiments, in order to implement foldable characteristics, a first thickness TT1 from the reflective layer 520 to the light blocking layer 540 may be 100 µm or less. Here, the first thickness TT1 refers to a distance from a lower surface of the reflective layer 520 to an upper surface of the light blocking layer 540. The first thickness TT1 is 100 µm or less, and thus, it may be relatively easy for the display device 10 to implement the foldable characteristics.

As described above, the display device 10 according to some embodiments includes the light blocking layer 540 located on an upper surface of the display panel 100 and including the ultraviolet absorber, and may thus prevent the deterioration of the code patterns 535 and the light emitting layers 172 due to the ultraviolet light. In addition, the foldable characteristics may be implemented by limiting a thickness of the stacked structure 500.

Figure 11:
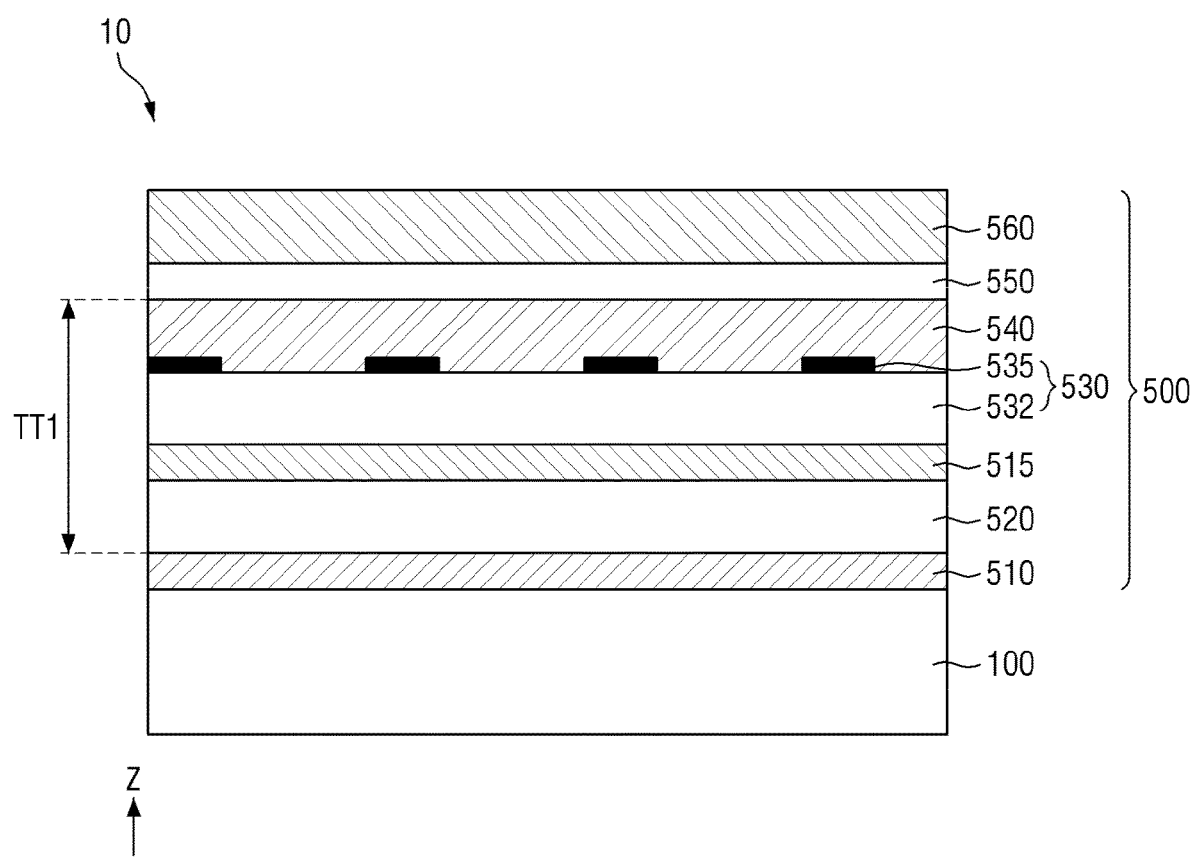
FIG. 11 is a schematic cross-sectional view illustrating a display device according to some embodiments of the present disclosure.

FIG. 11 is a schematic cross-sectional view illustrating a display device according to some embodiments.

Referring to FIG. 11, a display device 10 according to some embodiments is different from the display device according to some embodiments described above with reference to FIG. 6 in that it includes a stacked structure 500 further including a third coupling member 550 and a cover window 560 located on the light blocking layer 540. Hereinafter, a description of some contents overlapping those according to some embodiments described above with reference to FIG. 6 may be omitted, and contents different from those of embodiments described above with reference to FIG. 6 will mainly be described.

The third coupling member 550 may be located on the light blocking layer 540. The third coupling member 550 may adhere the cover window 560 located on the third coupling member 550 onto the light blocking layer 540. The third coupling member 550 may be a pressure sensitive adhesive (PSA) like the above-described first coupling member 510.

The cover window 560 may be located on the third coupling member 550. The cover window 560 covers the display panel 100 to serve to protect the display panel 100. The cover window 560 may be made of a transparent material, and may include, for example, glass or plastic. When the cover window 560 includes the glass, the glass may be an ultra thin glass (UTG) glass having a thickness of 0.1 mm or less. When the cover window 560 includes the plastic, the plastic may be a transparent polyimide film, but embodiments according to the present disclosure are not limited thereto.

According to some embodiments, damage to the display panel 100 may be prevented by forming the stacked structure 500 including the third coupling member 550 and the cover window 560.

Figure 12:
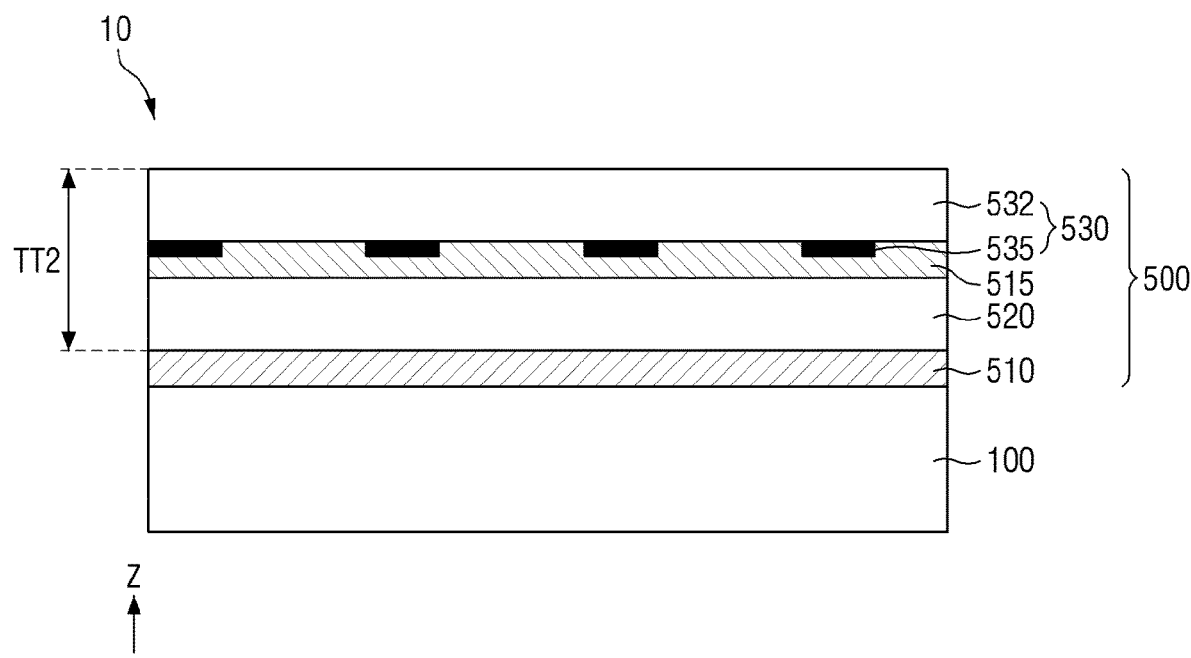
FIG. 12 is a schematic cross-sectional view illustrating a display device according to some embodiments of the present disclosure.

FIG. 12 is a schematic cross-sectional view illustrating a display device according to some embodiments.

Referring to FIG. 12, the embodiments illustrated with respect to FIG. 12 are different from the embodiments described above with reference to FIG. 6 in that an ultraviolet absorber is included in a base 532 of a code pattern part 530. Hereinafter, a description of some contents overlapping those according to some embodiments described above with reference to FIG. 6 may be omitted, and contents different from those of embodiments described above with reference to FIG. 6 will mainly be described.

A display device 10 may include a first coupling member 510, a reflective layer 520, a second coupling member 515, and a code pattern part 530 located on the display panel 100.

The code pattern part 530 may be adhered to the reflective layer 520 through the second coupling member 515. The second coupling member 515 may be in direct contact with a base 532 and code patterns 535 of the code pattern part 530. For example, the second coupling member 515 may be in direct contact with portions of the lower surface of the base 532 and lower surfaces and side surfaces of the code patterns 535. The code patterns 535 of the code pattern part 530 may be located on one surface of the base 532, that is, on the lower surface of the base 532 facing the display panel 100. A portion of the second coupling member 515 may be located between the code patterns 535.

The base 532 of the code pattern part 530 may be located at the uppermost portion of the display device 10. According to some embodiments, the base 532 may include an ultraviolet absorber. The base 532 may be manufactured in the form of a film by mixing a polymer resin and the ultraviolet absorber with each other. When the ultraviolet absorber is included in the base 532, a stacked structure 500 does not need to include a separate layer for ultraviolet absorption, such that a thickness of the stacked structure 500 may be reduced. The base 532 may have a light transmittivity of 20% or less at a wavelength of 380 nm. According to some embodiments, the base 532 may have a light transmittivity of 20% or less at a wavelength of 405 nm.

According to some embodiments, in the stacked structure 500, in order to implement foldable characteristics, a second thickness TT2 from the reflective layer 520 to the base 532 of the code pattern part 530 may be 100 µm or less. Here, the second thickness TT2 refers to a distance from a lower surface of the reflective layer 520 to an upper surface of the base 532. The second thickness TT2 is 100 µm or less, and thus, it may be relatively easy for the display device 10 to implement the foldable characteristics.

Figure 13:
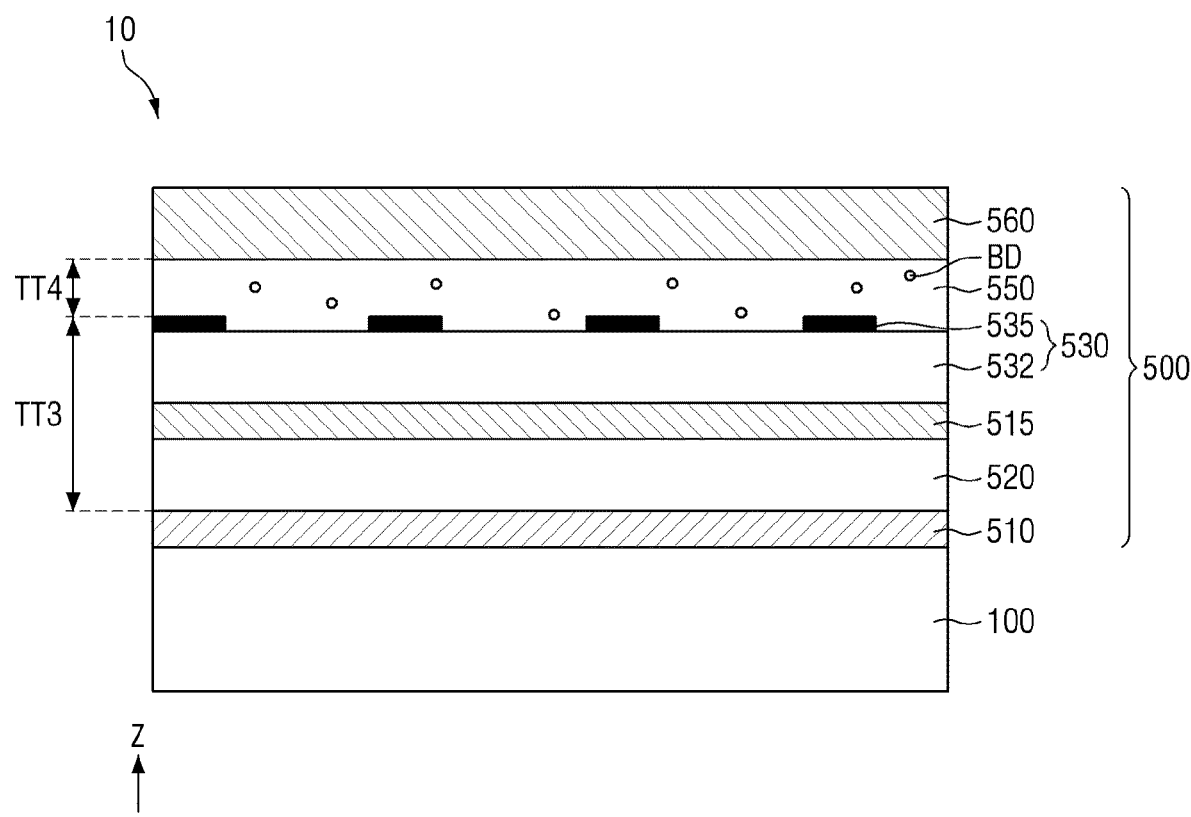
FIG. 13 is a schematic cross-sectional view illustrating a display device according to some embodiments of the present disclosure.

FIG. 13 is a schematic cross-sectional view illustrating a display device according to some embodiments.

Referring to FIG. 13, a display device 10 according to some embodiments is different from the display devices according to embodiments described above with reference to FIGS. 6, 11, and 12 in that it includes a third coupling member 550 including diffusion particles BD and an ultraviolet absorber and a cover window 560, which are located on a code pattern part 530. Hereinafter, a description of some contents overlapping those of the above-described embodiments may be omitted, and contents different from those of the above-described embodiments will mainly be described.

The display device 10 may include a first coupling member 510, a reflective layer 520, a second coupling member 515, and a code pattern part 530 located on the display panel 100. In addition, the display device 10 may further include the third coupling member 550 located on the code pattern part 530 and the cover window 560 adhered onto the third coupling member 550.

The third coupling member 550 may be located on the code pattern part 530. The third coupling member 550 may adhere the cover window 560 located on the third coupling member 550 onto the code pattern part 530. The third coupling member 550 may be a pressure sensitive adhesive (PSA) like the above-described first coupling member 510.

The third coupling member 550 may be in direct contact with a base 532 and code patterns 535 of the code pattern part 530. For example, the third coupling member 550 may be in direct contact with portions of an upper surface of the base 532 and upper surfaces and side surfaces of the code patterns 535. The code patterns 535 of the code pattern part 530 may be located on one surface of the base 532, that is, on the upper surface of the base 532 facing the cover window 560. A portion of the third coupling member 550 may be located between the code patterns 535.

According to some embodiments, the third coupling member 550 may include the diffusion particles BD and the ultraviolet absorber. The third coupling member 550 may be manufactured by including diffusion particles BD and an ultraviolet absorber in a pressure sensitive adhesive PSA. The diffusion particles BD diffuse the light of the infrared wavelength band emitted from the position input device to allow the light of the infrared wavelength band to be easily absorbed by the code pattern part 530. The diffusion particle BD may be silica, but embodiments according to the present disclosure are not limited thereto.

The ultraviolet absorber may be included in the third coupling member 550. When the ultraviolet absorber is included in the third coupling member 550, a stacked structure 500 does not need to include a separate layer for ultraviolet absorption, such that a thickness of the stacked structure 500 may be reduced. Accordingly, it may be relatively easy for the display device 10 to implement foldable characteristics.

According to some embodiments, in the stacked structure 500, in order to implement the foldable characteristics, a third thickness TT3 from the reflective layer 520 to the code pattern 535 of the code pattern part 530 may be 100 μm or less. Here, the third thickness TT3 refers to a distance from a lower surface of the reflective layer 520 to an upper surface of the code pattern 535. In addition, in the stacked structure 500, a thickness TT4 of the third coupling member 550 may be 100 μm or less. Here, stress may be applied to the stacked structure 500 at the time of folding and unfolding. Because the reflective layer 520 to the code patterns 535 of the code pattern part 530 are adhered to each other by the second coupling member 515 to behave together, similar stress is applied to the reflective layer 520 to the code patterns 535 of the code pattern part 530, but significantly low stress is applied to the third coupling member 550 having a great elastic modulus. Accordingly, in consideration of the foldable characteristics in the stacked structure 500, thickness ranges may be set separately for the third thickness TT3 and the thickness TT4 of the third coupling member 550.

According to some embodiments, the third thickness TT3 from the reflective layer 520 to the code pattern 535 of the code pattern part 530 and the thickness TT4 of the third coupling member 550 are set to 100 μm or less, respectively, and thus, it may be relatively easy for the display device 10 to implement the foldable characteristics.

Figure 14:
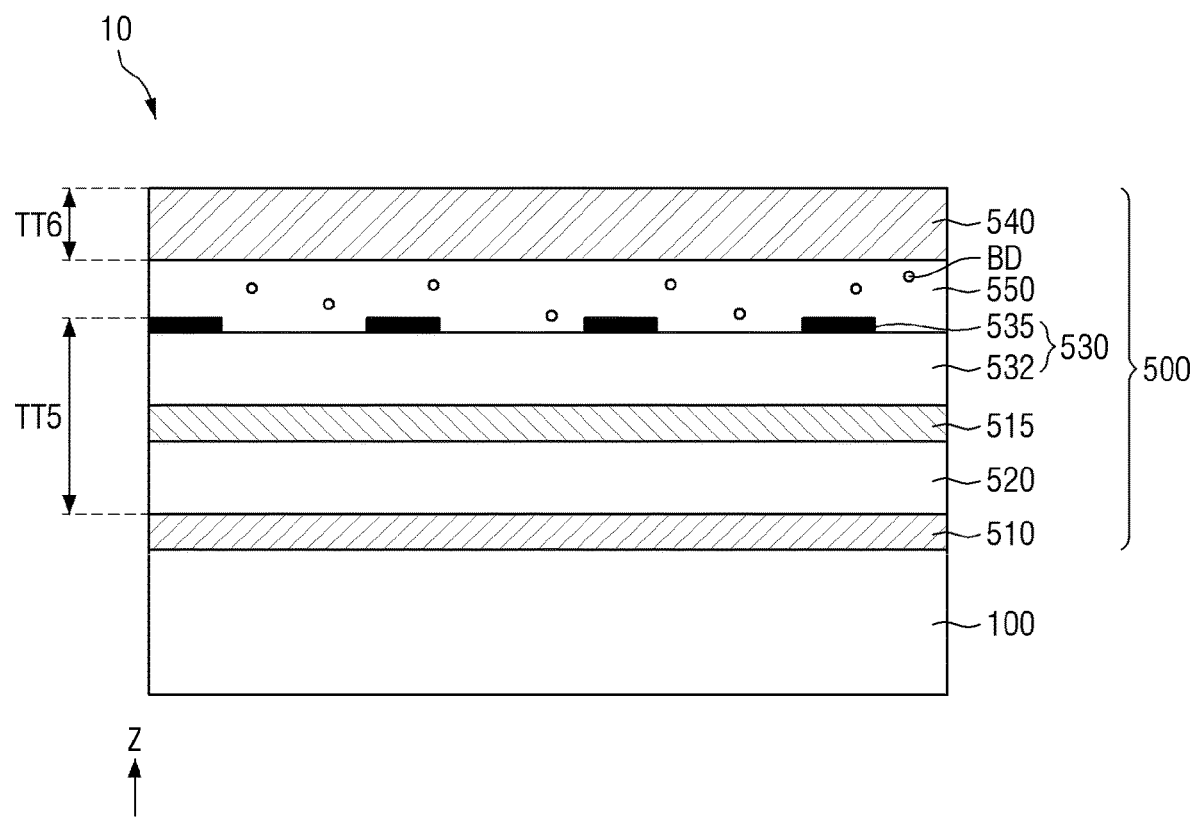
FIG. 14 is a schematic cross-sectional view illustrating a display device according to some embodiments of the present disclosure.

FIG. 14 is a schematic cross-sectional view illustrating a display device according to some embodiments.

Referring to FIG. 14, a display device 10 according to some embodiments is different from the display devices according to embodiments described above with reference to FIGS. 6, 11, 12, and 13 in that it includes a third coupling member 550 including diffusion particles BD and a light blocking layer 540, which are located on a code pattern part 530. Hereinafter, a description of some contents overlapping those of the above-described embodiments may be omitted, and contents different from those of the above-described embodiments will mainly be described.

The display device 10 may include a first coupling member 510, a reflective layer 520, a second coupling member 515, and a code pattern part 530 located on the display panel 100. In addition, the display device 10 may further include the third coupling member 550 located on the code pattern part 530 and the light blocking layer 540 adhered onto the third coupling member 550.

The third coupling member 550 may include the diffusion particles BD. The third coupling member 550 includes the diffusion particles BD to diffuse the light of the infrared wavelength band emitted from the position input device 20, thereby allowing the light of the infrared wavelength band to be easily absorbed by the code pattern part 530. The diffusion particle BD may be silica, but embodiments according to the present disclosure are not limited thereto.

The light blocking layer 540 may be located on the third coupling member 550. The light blocking layer 540 may include a resin including an ultraviolet absorber. The light blocking layer 540 may include the same material as the light blocking layer 540 described above with reference to FIG. 6. According to some embodiments, the light blocking layer 540 may be manufactured in the form of a film or a plate, unlike embodiments of FIG. 6, and be adhered to the third coupling member 550. When the light blocking layer 540 is manufactured in the form of the film or the plate and is adhered to the third coupling member 550, a process may be simplified.

According to some embodiments, in a stacked structure 500, in order to implement foldable characteristics, a fourth thickness TT5 from the reflective layer 520 to the code pattern 535 of the code pattern part 530 may be 100 μm or less. Here, the fourth thickness TT5 refers to a distance from a lower surface of the reflective layer 520 to an upper surface of the code pattern 535. In addition, in the stacked structure 500, a thickness TT6 of the light blocking layer 540 may be 100 μm or less. According to some embodiments, the fourth thickness TT5 from the reflective layer 520 to the code pattern 535 of the code pattern part 530 and the thickness TT6 of the light blocking layer 540 are set to 100 μm or less, respectively, and thus, it may be relatively easy for the display device 10 to implement the foldable characteristics.

Figure 15:
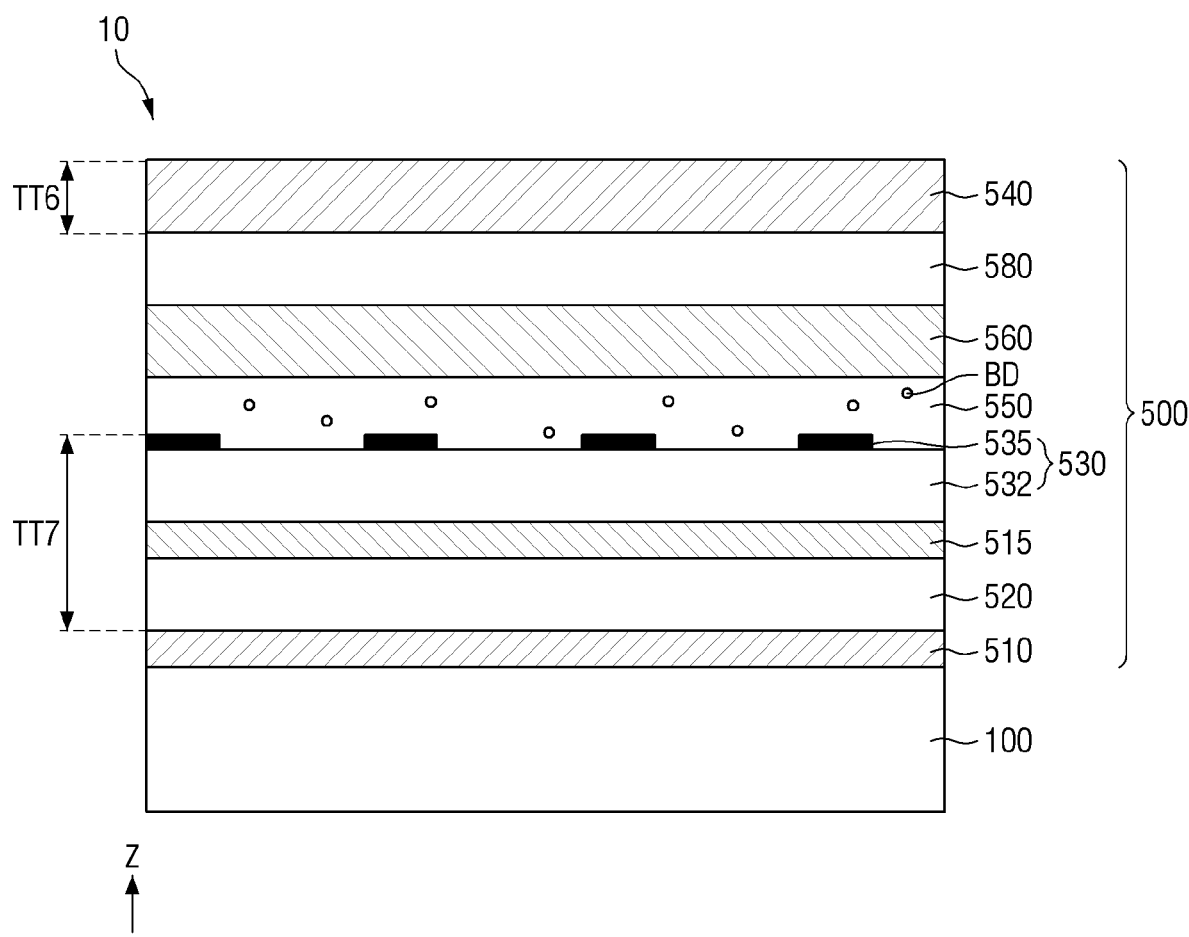
FIG. 15 is a schematic cross-sectional view illustrating a display device according to some embodiments of the present disclosure.

FIG. 15 is a schematic cross-sectional view illustrating a display device according to some embodiments.

Referring to FIG. 15, a display device 10 according to some embodiments is different from the display devices according to embodiments described above with reference to FIGS. 6, 11, 12, 13, and 14 in that it includes a cover window 560, a fourth coupling member 580, and a light blocking layer 540 located on a third coupling member 550 including diffusion particles BD. Hereinafter, a description of some contents overlapping those of the above-described embodiments may be omitted, and contents different from those of the above-described embodiments will mainly be described.

The display device 10 may include a first coupling member 510, a reflective layer 520, a second coupling member 515, a code pattern part 530, and the third coupling member 550 located on the display panel 100. In addition, the display device may further include the cover window 560, the fourth coupling member 580, and the light blocking layer 540 located on the third coupling member 550.

The cover window 560 may be located on the third coupling member 550, and may be adhered to the code pattern part 530 through the third coupling member 550. The fourth coupling member 580 may be located on the cover window 560 to adhere the light blocking layer 540 located on the fourth coupling member 580 to the cover window 560. The fourth coupling member 580 may include the same material as the above-described first coupling member 510, and may be, for example, a pressure sensitive adhesive (PSA).

The light blocking layer 540 may be located on the fourth coupling member 580. The light blocking layer 540 may include a resin including an ultraviolet absorber as described above with reference to FIG. 14. The light blocking layer 540 may be manufactured in the form of a film or a plate and be adhered to the third coupling member 550, thereby simplifying a process.

According to some embodiments, in a stacked structure 500, in order to implement foldable characteristics, a fifth thickness TT7 from the reflective layer 520 to the code pattern 535 of the code pattern part 530 may be 100 μm or less. Here, the fifth thickness TT7 refers to a distance from a lower surface of the reflective layer 520 to an upper surface of the code pattern 535. In addition, in the stacked structure 500, a thickness TT6 of the light blocking layer 540 may be 100 μm or less. According to some embodiments, the fifth thickness TT7 from the reflective layer 520 to the code pattern 535 of the code pattern part 530 and the thickness TT6 of the light blocking layer 540 are set to 100 μm or less, respectively, and thus, it may be relatively easy for the display device 10 to implement the foldable characteristics.

Figure 16:
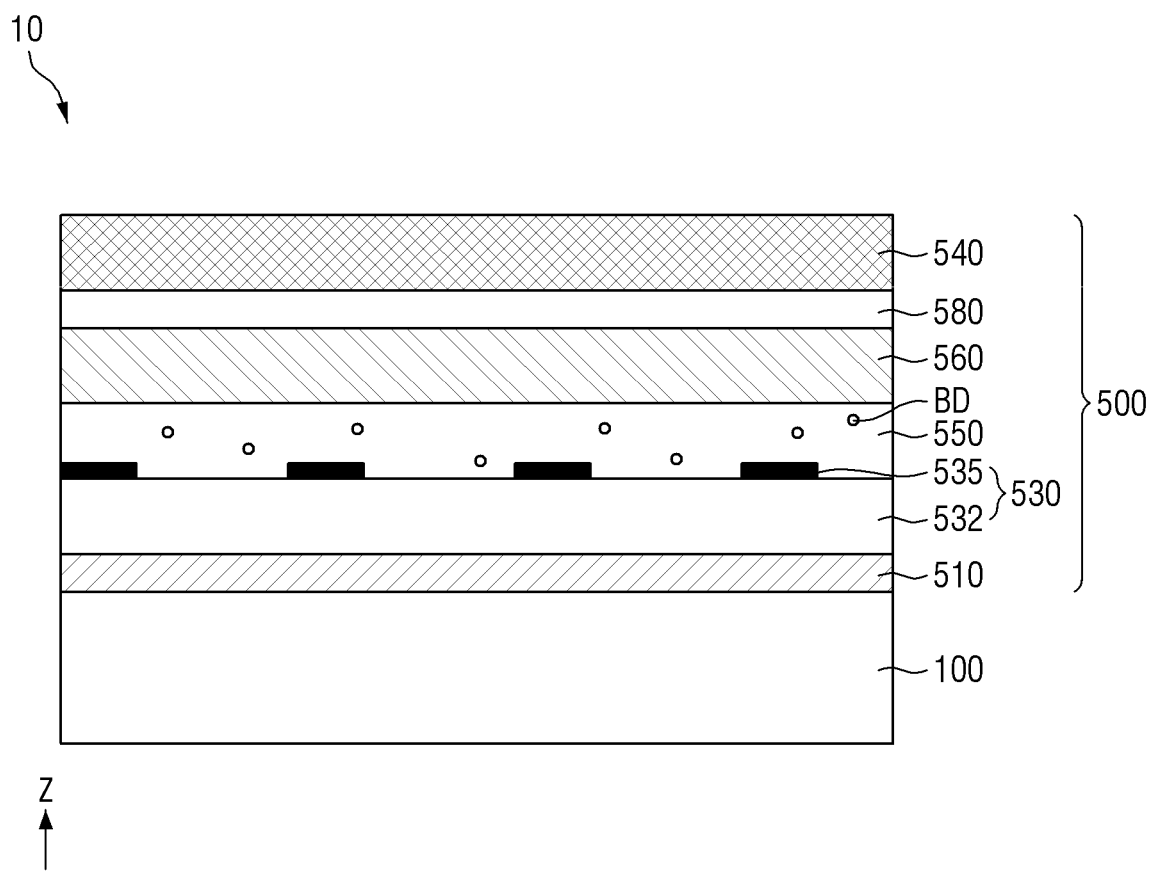
FIG. 16 is a schematic cross-sectional view illustrating a display device according to some embodiments of the present disclosure.

FIG. 16 is a schematic cross-sectional view illustrating a display device according to some embodiments.

Referring to FIG. 16, a display device 10 according to some embodiments is different from the display device according to some embodiments described above with reference to FIG. 15 in that a third coupling member 550 including diffusion particles BD further includes an ultraviolet absorber. Hereinafter, a description of some contents overlapping those of the above-described embodiments may be omitted, and contents different from those of the above-described embodiments will mainly be described.

The display device 10 may include a first coupling member 510, and a code pattern part 530 located on the display panel 100. In addition, the display device 10 may further include the third coupling member 550 including the ultraviolet absorber and the diffusion particles BD, a cover window 560, a fourth coupling member 580, and a light blocking layer 540, which are located on the code pattern part 530.

The third coupling member 550 may include the ultraviolet absorber and the diffusion particles BD like the third coupling member 550 according to some embodiments described above with reference to FIG. 13. That is, the ultraviolet absorber may be included in each of the third coupling member 550 and the light blocking layer 540.

According to some embodiments, the third coupling member 550 and the light blocking layer 540 may have the same light transmittivity or different light transmittivities at a wavelength of 380 nm. For example, each of the third coupling member 550 and the light blocking layer 540 may have a light transmittivity of 20% or less at a wavelength of 380 nm. According to some embodiments, the third coupling member 550 and the light blocking layer 540 may have the same light transmittivity or different light transmittivities at a wavelength of 405 nm. For example, each of the third coupling member 550 and the light blocking layer 540 may have a light transmittivity of 20% or less at a wavelength of 405 nm. According to some embodiments, the third coupling member 550 may have a light transmittivity of 20% or less at a wavelength of 380 nm, and the light blocking layer 540 may have a light transmittivity of 20% or less at a wavelength of 405 nm. According to some embodiments, the third coupling member 550 may have a light transmittivity of 20% or less at a wavelength of 405 nm, and the light blocking layer 540 may have a light transmittivity of 20% or less at a wavelength of 380 nm.

According to some embodiments, each of the third coupling member 550 and the light blocking layer 540 may include the ultraviolet absorber to provide a high level of ultraviolet blocking property, thereby further preventing the deterioration of the code patterns 535 and the light emitting layers 172.

In concluding the detailed description, those skilled in the art will appreciate that many variations and modifications can be made to the example embodiments without substantially departing from the principles of the invention. Therefore, the disclosed example embodiments of the invention are used in a generic and descriptive sense only and not for purposes of limitation. Rather, the scope of embodiments according to the present disclosure is defined according to the appended claims, and their equivalents.

What is claimed is:

1. A display device comprising:
a display panel; and
a stacked structure on the display panel,
wherein the stacked structure includes:
a first coupling member on the display panel;
a reflective layer on the first coupling member;
a second coupling member on the reflective layer;
a code pattern part on the second coupling member; and
a light blocking layer on the code pattern part and including an ultraviolet absorber, and
a thickness between a lower surface of the reflective layer and an upper surface of the light blocking layer is 100 μm or less.

2. The display device of claim 1, wherein the light blocking layer has a light transmittivity of 20% or less at a wavelength of 380 nm.

3. The display device of claim 1, wherein the light blocking layer has a light transmittivity of 20% or less at a wavelength of 405 nm.

4. The display device of claim 1, wherein the code pattern part includes a base and code patterns on the base, and the light blocking layer is in contact with the base and the code patterns.

5. The display device of claim 1, further comprising:
a third coupling member on the light blocking layer; and
a cover window on the third coupling member.

6. The display device of claim 1, further comprising a third coupling member between the code pattern part and the light blocking layer,
wherein the third coupling member includes diffusion particles.

7. The display device of claim 6, further comprising a cover window and a fourth coupling member between the third coupling member and the light blocking layer,
wherein the cover window is on the third coupling member, and the fourth coupling member is between the cover window and the light blocking layer.

8. The display device of claim 7, wherein the light blocking layer is a film or a plate.

9. A display device comprising:
a display panel; and
a stacked structure on the display panel,
wherein the stacked structure includes:
a first coupling member on the display panel;
a reflective layer on the first coupling member;
a second coupling member on the reflective layer;
a code pattern part on the second coupling member;

a third coupling member on the code pattern part and including an ultraviolet absorber; and
a cover window on the third coupling member, and
a thickness between a lower surface of the reflective layer and an upper surface of the code pattern part is 100 μm or less.

10. The display device of claim 9, wherein a thickness of the third coupling member is 100 μm or less.

11. The display device of claim 9, wherein the third coupling member includes diffusion particles.

12. The display device of claim 9, wherein the third coupling member has a light transmittivity of 20% or less at a wavelength of 380 nm.

13. The display device of claim 9, further comprising:
a fourth coupling member on the cover window; and
a light blocking layer on the fourth coupling member,
wherein the light blocking layer includes an ultraviolet absorber.

14. A display device comprising:
a display panel; and
a stacked structure on the display panel,
wherein the stacked structure includes:
a first coupling member on the display panel;
a reflective layer on the first coupling member;
a second coupling member on the reflective layer; and
a code pattern part on the second coupling member and including a base and code patterns on one surface of the base,
the base includes an ultraviolet absorber, and
a thickness between a lower surface of the reflective layer and an upper surface of the code pattern part is 100 μm or less.

15. The display device of claim 14, wherein the stacked structure of the display panel includes a substrate having a light transmittivity of 20% or less at a wavelength of 380 nm.

16. A position input system comprising:
a display device configured to display an image; and
a position input device configured to input position coordinate data to the display device,
wherein the display device includes:
a display panel; and
a stacked structure on the display panel,
the stacked structure includes:
a first coupling member on the display panel;
a reflective layer on the first coupling member;
a second coupling member on the reflective layer;
a code pattern part on the second coupling member and including code patterns; and
a light blocking layer on the code pattern part and including an ultraviolet absorber, and
a thickness between a lower surface of the reflective layer and an upper surface of the light blocking layer is 100 μm or less.

17. The position input system of claim 16, wherein the position input device includes:
a code detection unit configured to detect the code patterns;
a code processor configured to receive shape data for the code patterns, configured to extract data codes corresponding to shapes of the code patterns, and configured to generate the position coordinate data corresponding to the data codes; and
a communication module configured to transmit the position coordinate data to the display device.

18. The position input system of claim 16, wherein the light blocking layer has a light transmittivity of 20% or less at a wavelength of 380 nm.

19. The position input system of claim 16, wherein the light blocking layer has a light transmittivity of 20% or less at a wavelength of 405 nm.

20. The position input system of claim 16, wherein the reflective layer includes:
a first alignment film;
a second alignment film on the first alignment film; and
a liquid crystal layer between the first alignment film and the second alignment film and including cholesteric liquid crystals.

* * * * *